(12) United States Patent
Zhou et al.

(10) Patent No.: US 11,251,904 B2
(45) Date of Patent: Feb. 15, 2022

(54) POLAR CODE ENCODING METHOD AND APPARATUS

(71) Applicant: HUAWEI TECHNOLOGIES CO., LTD., Guangdong (CN)

(72) Inventors: Yue Zhou, Hangzhou (CN); Jun Wang, Hangzhou (CN); Rong Li, Hangzhou (CN); Ying Chen, Hangzhou (CN); Jian Wang, Hangzhou (CN); Huazi Zhang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 111 days.

(21) Appl. No.: 16/778,812

(22) Filed: Jan. 31, 2020

(65) Prior Publication Data
US 2020/0169352 A1    May 28, 2020

Related U.S. Application Data

(63) Continuation of application No. PCT/CN2018/097772, filed on Jul. 31, 2018.

(30) Foreign Application Priority Data

Aug. 2, 2017    (CN) .......................... 201710653425.6

(51) Int. Cl.
    *H04L 1/00* (2006.01)
(52) U.S. Cl.
    CPC .......... *H04L 1/0057* (2013.01); *H04L 1/0076* (2013.01); *H04L 1/0068* (2013.01)
(58) Field of Classification Search
    CPC ................ H04L 1/0057; H04L 1/0076; H04L 1/0068; H03M 13/13; H03M 13/618; H03M 13/6362; H03M 13/155; H04N 1/04
    See application file for complete search history.

(56) References Cited

U.S. PATENT DOCUMENTS 10,148,289 B2    12/2018  Shen et al.
10,659,194 B2     5/2020  Wang et al.
(Continued)

FOREIGN PATENT DOCUMENTS

CN    102694625 A    9/2012
CN    103023618 A    4/2013
(Continued)

OTHER PUBLICATIONS

NTT DOCOMO:"Sequence design of Polar codes",3GPP Draft; R1-1708489,May 14, 2017 (May 14, 2017), XP051273681,total 5 pages.
(Continued)

*Primary Examiner* — Oussama Roudani
(74) *Attorney, Agent, or Firm* — Womble Bond Dickinson (US) LLP

(57) ABSTRACT

This application relates to the field of communications technologies, and discloses a polar code encoding method and apparatus, to improve accuracy of reliability computation and sorting of polar channels. The method is: obtaining a first sequence used to encode K to-be-encoded bits, where the first sequence includes sequence numbers of N polar channels, and the sequence numbers of the N polar channels are arranged in the first sequence based on corresponding reliabilities of the N polar channels, where K is a positive integer, N is a mother code length of a polar code, N is a positive integer that is a power of 2, and K≤N; selecting sequence numbers of K polar channels from the first sequence in descending order of the reliabilities; and placing the to-be-encoded bits based on the selected sequence numbers of the K polar channels, and performing polar code encoding on the to-be-encoded bits.

14 Claims, 3 Drawing Sheets

(56) References Cited

U.S. PATENT DOCUMENTS

| | | | |
|---|---|---|---|
| 11,146,358 B2* | 10/2021 | Laddu | H04W 72/042 |
| 2016/0013887 A1 | 1/2016 | Shen et al. | |
| 2016/0164629 A1 | 6/2016 | Ahn et al. | |
| 2017/0111060 A1* | 4/2017 | Huang | H03M 13/45 |
| 2018/0026663 A1* | 1/2018 | Wu | H03M 13/6362 714/776 |
| 2018/0323803 A1* | 11/2018 | Palgy | H03M 13/618 |
| 2018/0351696 A1* | 12/2018 | Yang | H04L 1/0057 |
| 2018/0358985 A1* | 12/2018 | Kim | H03M 13/2792 |
| 2019/0089380 A1 | 3/2019 | Shen et al. | |
| 2019/0372713 A1 | 12/2019 | Xu et al. | |
| 2020/0195276 A1 | 6/2020 | Wu et al. | |
| 2021/0306096 A1* | 9/2021 | Shelby | H04L 1/0041 |

FOREIGN PATENT DOCUMENTS

| | | |
|---|---|---|
| CN | 103281166 A | 9/2013 |
| CN | 106877973 A | 6/2017 |
| CN | 107592181 A | 1/2018 |
| CN | 108667568 A | 10/2018 |
| CN | 109286402 A | 1/2019 |
| CN | 109286404 A | 1/2019 |
| CN | 105075163 B | 2/2019 |
| EP | 2899911 A1 | 7/2015 |
| EP | 3457606 A1 | 3/2019 |
| EP | 3579468 A1 | 12/2019 |
| WO | 2016001930 A1 | 1/2016 |

OTHER PUBLICATIONS

Huawei et al.,"Construction schemes for polar codes",3GPP TSG RAN WG1 Meeting #88 R1-1701702,Athens, Greece, Feb. 13-17, 2017,total 7 pages.

Samsung: "Design of a Nested Sequence for Polar Codes",3GPP Draft; R1-1705425,Apr. 2, 2017 (Apr. 2, 2017), XP051243555,total 8 pages.

Huawei et al.,"Theoretical analysis of the sequence generation",3GPP TSG RAN WG1 Meeting #88bis R1-1705084, Spokane, USA, Apr. 3-7, 2017,total 8 pages.

Huawei et al: "Polar code design and rate matching",3GPP Draft; R1-167209,Aug. 13, 2016 (Aug. 13, 2016), XP051142532,total 5 pages.

Qualcomm Incorporated,"Sequence construction of Polar codes for control channel",3GPP TSG-RAN WG1 NR Ad-Hoc#2 ,R1-1711218,Jun. 27-30, 2017,Qingdao, P. R. China, total 18 pages.

* cited by examiner

POLAR CODE ENCODING METHOD AND APPARATUS

CROSS-REFERENCE TO RELATED APPLICATIONS

This application is a continuation of International Application No. PCT/CN2018/097772, filed on Jul. 31, 2018, which claims priority to Chinese Patent Application No. 201710653425.6, filed on Aug. 2, 2017. The disclosures of the aforementioned applications are herein incorporated by reference in their entireties.

TECHNICAL FIELD

Embodiments of this application relate to the field of communications technologies, and in particular, to a polar code encoding method and apparatus.

BACKGROUND

Channel coding, as a most fundamental wireless access technology, plays a vital role in ensuring reliable data transmission. In an existing wireless communications system, a turbo code, a low-density parity-check (LDPC) code, and a polar code are usually used to perform channel coding. The turbo code cannot support information transmission at an excessively low or high code rate. Due to encoding/decoding characteristics of the turbo code and the LDPC code, for medium and short packet transmission, it is difficult for the turbo code and the LDPC code to achieve ideal performance in case of a limited code length. In terms of implementation, the turbo code and the LDPC code have relatively high computation complexity in an encoding/decoding implementation process. The polar code is a high-performance code that has been theoretically proved to be capable of achieving a Shannon capacity and that has relatively low encoding/decoding complexity, and therefore is applied increasingly widely.

However, as the wireless communications system evolves rapidly, a future communications system such as a fifth generation (5G) communications system has some new characteristics. For example, three most typical communications scenarios include enhanced mobile broadband (eMBB), massive machine type communications (mMTC), and ultra-reliable and low latency communications (URLLC). A higher requirement is imposed for encoding/decoding performance of a polar code in these communications scenarios.

Reliability sorting of polar channels plays a vital role in encoding/decoding performance of a polar code. However, in the current phase, accuracy of the reliability sorting of the polar channels is not ideal, affecting further improvement of the encoding/decoding performance of the polar code in an application process.

SUMMARY

Embodiments of this application provide a polar code encoding method and apparatus, to improve accuracy of reliability sorting of polar channels.

The specific technical solutions provided in the embodiments of this application are as follows:

According to a first aspect, a polar code encoding method is provided. To-be-encoded bits are obtained, where a length of the to-be-encoded bits is K, and K is a positive integer. A sequence used to encode the K to-be-encoded bits is obtained, and is denoted as a first sequence, where the first sequence is used to indicate sorting of reliability of N polar channels, the first sequence includes sequence numbers of the N polar channels, and the sequence numbers of the N polar channels are arranged in the first sequence based on the corresponding reliabilities of the N polar channels, where N is a mother code length of a polar code, N is a positive integer that is a power of 2, and K≤N. First K sequence numbers for which reliability is sorted higher are selected from the first sequence in descending order of the reliabilities. The to-be-encoded bits are mapped to polar channels having the first K sequence numbers, and polar code encoding is performed on the to-be-encoded bits. In this way, locations of an information bit and a fixed bit are determined by computing reliability of a polar channel of a polar code, where the locations are not related to a channel parameter and a code rate. This can reduce computation complexity during the polar code encoding.

In one embodiment, the first sequence is a second sequence or a subset of a second sequence, the second sequence includes sequence numbers of $N_{max}$ polar channels, and the sequence numbers of the $N_{max}$ polar channels are arranged in the second sequence based on the corresponding reliabilities of the $N_{max}$ polar channels, where $N_{max}$ is a positive integer that is a power of 2, and $N_{max} \geq N$.

In one embodiment, reliability of an $i^{th}$ polar channel in the second sequence is:

$$W_i = \sum_{(j=0)}^{n-1} B_j \times (\beta^j + a_0 \times b_0^j + B_{e1} \times a_1 \times b_1^j + B_{e2} \times a_2 \times b_2^j + \ldots)$$

where $0 \leq i \leq N-1$; $W_i$ is the reliability of the $i^{th}$ polar channel; i meets $i = B_{n-1} B_{n-2} \ldots B_0$, where $B_{n-1} B_{n-2} \ldots B_1 B_0$ is a binary representation of i; $B_j$ is a value of a $j^{th}$ bit in the binary representation of the channel sequence number i, where $B_j \in \{0,1\}$; $\beta$ is a real kernel function; $b_0$, $b_1$, and $b_2$ are different complex kernel functions; $a_0$, $a_1$, and $a_2$ are weighting factors; and $B_{e1}$ and $B_{e2}$ respectively indicate that corresponding complex functions have impact on reliability when an $e_1^{th}$ bit and an $e_2^{th}$ bit in the binary representation of the channel sequence number are 1.

In one embodiment, reliability of an $i^{th}$ polar channel in the second sequence is:

$$W_i = \sum_{(j=0)}^{n-1} B_j \times (\beta^j + a_0 \times b_0^j + B_{e1} \times a_1 \times b_1^j + B_{e2} \times a_2 \times b_2^j)$$

where $0 \leq i \leq N-1$; $W_i$ is the reliability of the $i^{th}$ polar channel; i meets $i = B_{n-1} B_{n-2} \ldots B_0$, where $B_{n-1} B_{n-2} \ldots B_1 B_0$ is a binary representation of i; $B_j$ is a value of a $j^{th}$ bit in the binary representation of the channel sequence number i, where $B_j \in \{0,1\}$; $\beta$ is a real kernel function; $b_0$, $b_1$, and $b_2$ are different complex kernel functions; $a_0$, $a_1$, and $a_2$ are weighting factors; and $B_{e1}$ and $B_{e2}$ respectively indicate that corresponding complex functions have impact on reliability when an $e_1^{th}$ bit and an $e_2^{th}$ bit in the binary representation of the channel sequence number are 1.

In one embodiment, the weighting factors and the complex kernel functions are respectively $a_0 = 0.169$, $b_0 = 0.8805$, $a_1 = -0.096$, $b_1 = 0.2432 + 0.2432I$, where I is an imaginary unit, $e_1 = 6$, $a_2 = 0.038$, $b_2 = 0.8262$, and $e_2 = 9$; and the reliability of the $i^{th}$ polar channel in the second sequence is:

$$W_i = \sum_{(j=0)}^{n-1} B_j \times (\beta^j + 0.169 \times 0.8805^j -$$

$$B_6 \times 0.096 \times (0.2432 + 0.2432I)^j + B_9 \times 0.038 \times 0.8262^j).$$

In one embodiment, the weighting factors and the complex kernel functions are respectively $a_0=0.1733$, $b_0=0.5486$, $a_1=-0.0279$, $b_1=0.5222+0.5222I$, where I is an imaginary unit, $e_1=5$, $a_2=-0.07$, $b_2=0$, and $e_2=6$; and the reliability of the $i^{th}$ polar channel in the second sequence is:

$$W_i =$$

$$\sum_{(j=0)}^{n-1} B_j \times (\beta^j + 0.1733 \times 0.5486^j - B_5 \times 0.0279 \times (0.5222 + 0.5222I)^j -$$

$$B_6 \times 0.07 \times 0^j).$$

In one embodiment, reliability of an $i^{th}$ polar channel in the second sequence is:

$$W_i = \sum_{(j=0)}^{n-1} B_j \times (\beta^j + a_0 \times b_0^j + B_{e1} \times a_1 \times b_1^j)$$

where $0 \le i \le N-1$; $W_i$ is the reliability of the $i^{th}$ polar channel; i meets $i=B_{n-1}B_{n-2} \ldots B_0$, where $B_{n-1}B_{n-2} \ldots B_1B_0$ is a binary representation of i; $B_j$ is a value of a $j^{th}$ bit in the binary representation of the channel sequence number i, where $B_j \in \{0,1\}$; $\beta$ is a real kernel function; $b_0$ and $b_1$ are different complex kernel functions; $a_0$ and $a_1$ are weighting factors; and $B_{e1}$ indicates that a corresponding complex function has impact on reliability when an $e_1^{th}$ bit in the binary representation of the channel sequence number is 1.

In one embodiment, the weighting factors and the complex kernel functions are respectively $a_0=0.169$, $b_0=0.601$, $a_1=-0.07694$, $b_1=0.0769+0.0769I$, where I is an imaginary unit, and $e_1=6$; and the reliability of the $i^{th}$ polar channel in the second sequence is:

$$W_i = \sum_{(j=0)}^{n-1} B_j \times (\beta^j + 0.169 \times 0.601^j - B_6 \times 0.07694 \times (0.0769 + 0.0769I)^j).$$

In one embodiment, the weighting factors and the complex kernel functions are respectively $a_0=0.169$, $b_0=0.601$, $a_1=-0.0475$, $b_1=0$, and $e_1=6$; and the reliability of the $i^{th}$ polar channel in the second sequence is:

$$W_i = \sum_{(j=0)}^{n-1} B_j \times (\beta^j + 0.169 \times 0.601^j - B_6 \times 0.0475 \times 0^j).$$

In one embodiment, $\beta=2^{1/4}$.

In one embodiment, the second sequence may be a part or all of any one of a sequence 1 to a sequence 20 in this specification, sequence numbers of N polar channels in the second sequence are arranged in ascending order of the reliability of the N polar channels, and a smallest value of the sequence numbers of the polar channels is 0.

According to a second aspect, a polar code encoding apparatus is provided. The apparatus has functions of implementing the method according to the first aspect and any embodiment of the first aspect. The functions may be implemented by hardware, or may be implemented by hardware executing corresponding software. The hardware or software includes one or more modules corresponding to the foregoing functions.

In one embodiment, when some or all of the functions are implemented by using hardware, the polar code encoding apparatus includes: an input interface circuit, configured to obtain to-be-encoded bits; a logical circuit, configured to perform behavior according to the first aspect and any embodiment of the first aspect; and an output interface circuit, configured to output an encoded bit sequence.

In one embodiment, the polar code encoding apparatus may be a chip or an integrated circuit.

In one embodiment, when some or all of the functions are implemented by using software, the polar code encoding apparatus includes: a memory, configured to store a program; and a processor, configured to execute the program stored in the memory, where when the program is executed, the polar code encoding apparatus may implement the method according to the first aspect and any embodiment of the first aspect.

In one embodiment, the memory may be a physically independent unit, or may be integrated with the processor.

In one embodiment, when some or all of the functions are implemented by using software, the polar code encoding apparatus includes a processor. A memory configured to store a program is located outside of the encoding apparatus, and the processor is connected to the memory by using a circuit/cable, and is configured to read and execute the program stored in the memory.

According to a third aspect, a communications system is provided. The communications system includes a network device and a terminal. The network device or the terminal may perform the method according to the first aspect and any embodiment of the first aspect.

According to a fourth aspect, a computer storage medium is provided, where the computer storage medium stores a computer program. The computer program includes an instruction used to perform the method according to the first aspect and any embodiment of the first aspect.

According to a fifth aspect, an embodiment of this application provides a computer program product including an instruction. When the computer program product is run on a computer, the computer is enabled to perform the method according to the foregoing aspect.

According to a sixth aspect, a wireless device is provided, and includes an encoding apparatus configured to implement the first aspect and any embodiment of the first aspect, a modulator, and a transceiver, where the modulator is configured to modulate an encoded bit sequence, to obtain a modulated sequence; and the transceiver is configured to process the modulated sequence.

In one embodiment, the wireless device is a terminal or a network device.

DESCRIPTION OF EMBODIMENTS

Figure 1:
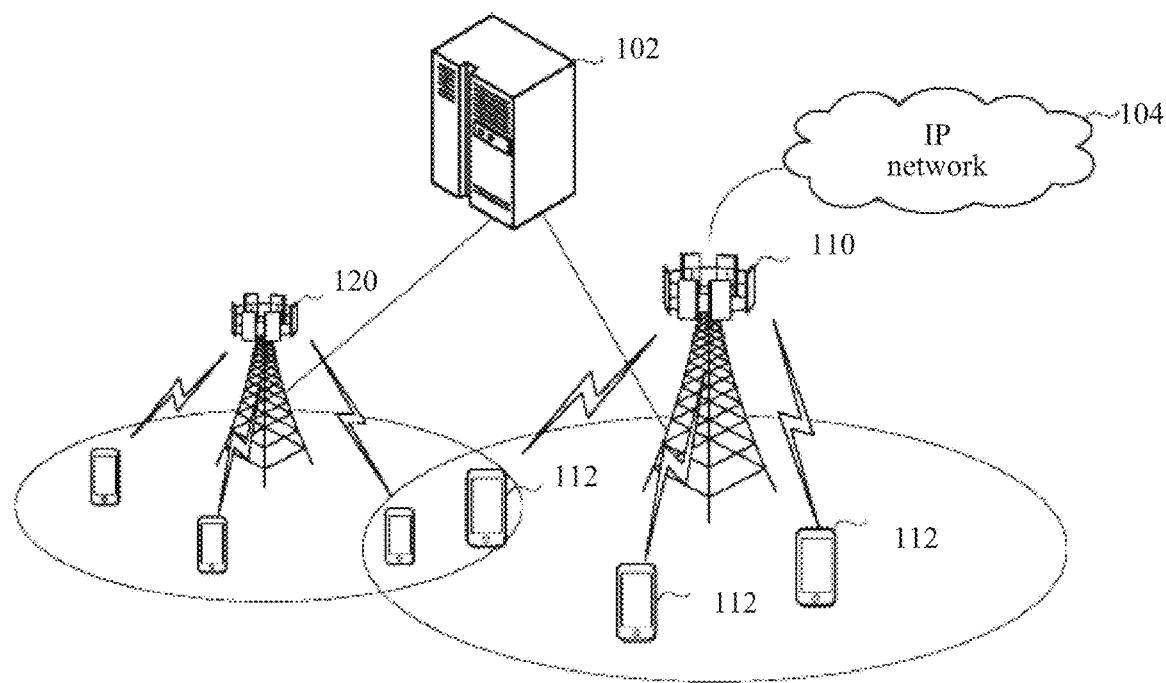
FIG. 1 is a schematic architectural diagram of a communications system to which an embodiment of this application is applied.

The following describes in detail the embodiments of this application with reference to accompanying drawings.

The embodiments of this application provide a polar code encoding method and apparatus. Reliability sorting is obtained based on reliability of polar channels, sequence numbers of polar channels used to send information bits are selected based on the reliability sorting, and polar code encoding is performed based on the selected sequence numbers for the information bits. In the embodiments of this application, reliability of each subchannel of a polar code can be more accurately computed. With reference to the accompanying drawings, the following describes in detail the encoding method and apparatus provided in the embodiments of the present invention.

For convenience of understanding the embodiments of this application, a polar code is briefly described below.

According to an encoding policy of the polar code, a noiseless channel is used to transmit information useful to a user, while a pure noisy channel is used to transmit agreed information or is not used to transmit information. The polar code is also a linear block code. An encoding matrix of the polar code is $G_N$. An encoding process is $x_1^N = u_1^N G_N$. $u_1^N = (u_1, u_2 \ldots, u_N)$ is a binary row vector, and has a length of N (namely, a code length). $G_N$ is an N×N matrix, and $G_N = F_2^{\otimes(log_2(N))}$. $F_2^{\otimes(log_2(N))}$ is defined as a Kronecker product of $log_2 N$ matrices $F_2$. The foregoing matrix $$F = \begin{bmatrix} 1 & 0 \\ 1 & 1 \end{bmatrix}.$$

In the encoding process of the polar code, some bits in $u_1^N$ are used to carry information and are referred to as information bits, and a set of indexes of these bits is denoted as A. The other bits are set to fixed values that are agreed on by a receive end and a transmit end in advance and are referred to as fixed bits or frozen bits, and a set of indexes of these bits is denoted as $A^c$ that is a complementary set of A. The encoding process of the polar code is equivalent to: $x_1^N = u_A G_N(A) \oplus u_{A^c} G_N(A^c)$. Herein, $G_N(A)$ is a submatrix obtained based on rows corresponding to the indexes in the set A in $G_N$, and $G_N(A^C)$ is a submatrix obtained based on rows corresponding to the indexes in the set $A^C$ in $G_N$. $u_A$ is an information bit set in $u_1^N$, and a quantity of information bits is K. Usually, various check bits including but not limited to a cyclic redundancy check (CRC) bit and a parity check (PC) bit are also included in the information bit set. $u_{A^c}$ is a fixed bit set in $u_1^N$, a quantity of fixed bits is (N−K), and the fixed bits are known bits. These fixed bits are usually set to 0. However, the fixed bits may be set to any value provided that the value is agreed on by the receive end and the transmit end in advance. In this way, encoded output of the polar code may be simplified as $x_1^N = u_A G_N(A)$. Herein, $u_A$ is the information bit set in $u_1^N$, and $u_A$ is a row vector having a length of K. In other words, |A|=K, where |•| represents a quantity of elements in a set, K is a size of an information block, $G_N(A)$ is the submatrix obtained based on the rows corresponding to the indexes in the set A in the matrix $G_N$, and $G_N(A)$ is a K×N matrix.

A construction process of the polar code is a process of selecting the set A. This determines performance of the polar code. The construction process of the polar code usually includes: determining, based on a code length N of a mother code, that there are N polar channels in total that respectively correspond to N rows of the encoding matrix; computing reliability of the polar channels; and using indexes of first K polar channels having higher reliability as elements in the set A, and using indexes corresponding to the remaining (N−K) polar channels as elements in the set $A^C$ of the indexes of the fixed bits. A location of the information bit depends on the set A, and a location of the fixed bit depends on the set $A^C$.

The solutions provided in the embodiments of this application relate to how to determine reliability of a polar channel. A basic inventive concept of the embodiments of this application is: The reliability of the polar channel may be indicated by using reliability. From a perspective of signal spectrum analysis, approximation of existing reliability to the reliability of the polar channel may be understood as domain transform of a signal. Similar to Fourier transform in which a $e^{jw}$ kernel is used to implement conversion of a signal between a time domain and a frequency domain, in the method, a β kernel is used to convert a signal from a channel sequence number domain to a weight domain of reliability. In a time-frequency signal analysis field, most commonly, Fourier transform and wavelet transform are included. The Fourier transform is restricted to a form of a kernel $e^{jw}$ of a trigonometric function. Therefore, in a time-frequency signal analysis process based on the Fourier transform, a time-domain identification capability and a frequency-domain identification capability cannot be realized simultaneously. During the wavelet transform, a wavelet transform kernel is used and there are versatile function forms. Therefore, a transient change of a signal in time domain can be captured during domain transform, and a good identification capability can be realized in both time domain and frequency domain. In the embodiments of this application, reliability of a polar channel is estimated by using a changeable transform kernel, thereby improving precision of sequence reliability estimation.

FIG. 1 is a schematic structural diagram of a wireless communications network 100 according to an embodiment of the present invention. FIG. 1 is merely an example, and any other wireless networks to which an encoding method or apparatus in the embodiments of the present invention can be applied shall fall within the protection scope of the present invention.

As shown in FIG. 1, the wireless communications network 100 includes a network device 110 and a terminal 112. When the wireless communications network 100 includes a core network 102, the network device 110 may further be connected to the core network 102. The network device 110 may further communicate with an IP network 104 such as the Internet, a private IP network, or another data network. A network device provides a service to a terminal within coverage. For example, referring to FIG. 1, the network device 110 provides wireless access for one or more terminals 112 within the coverage of the network device 110. In addition, an overlapping area may exist within coverage of network devices such as the network device 110 and a network device 120. Network devices can further communicate with each other. For example, the network device 110 may communicate with the network device 120.

The network device 110 may be a device that can communicate with a terminal device. and may be, for example, a base transceiver station (BTS) in a GSM system or CDMA system, or may be a NodeB (NB) in a WCDMA system, or may be an evolved NodeB (eNB or eNodeB) in an LTE system or a network side device in a future 5G network. Alternatively, the network device may be a relay station, an access point, an in-vehicle device, or the like. In a device to device (D2D) communications system, the network device may further be a terminal playing a role of a base station.

The terminal 112 may be user equipment (UE), an access terminal, a subscriber unit, a mobile station, a remote station, a remote terminal, a mobile device, a user terminal, a wireless communications device, a user agent, or a user apparatus. The access terminal may be a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, an in-vehicle device, a wearable device, a terminal device in a future 5G network, or the like. Based on the architecture of the communications system shown in FIG. 1, in the embodiments of this application, a polar code encoding method may be performed by the foregoing network device 110 or terminal 112. When the network device 110 or the terminal 112 is used as a transmit end to send data or information, the polar code encoding method may be used. Correspondingly, when the network device 110 or the terminal 112 is used as a receive end to receive data or information, a subchannel sequence needs to be first confirmed based on the method described in the present invention. The following describes in detail the polar code encoding method provided in the embodiments of this application.

Figure 2:
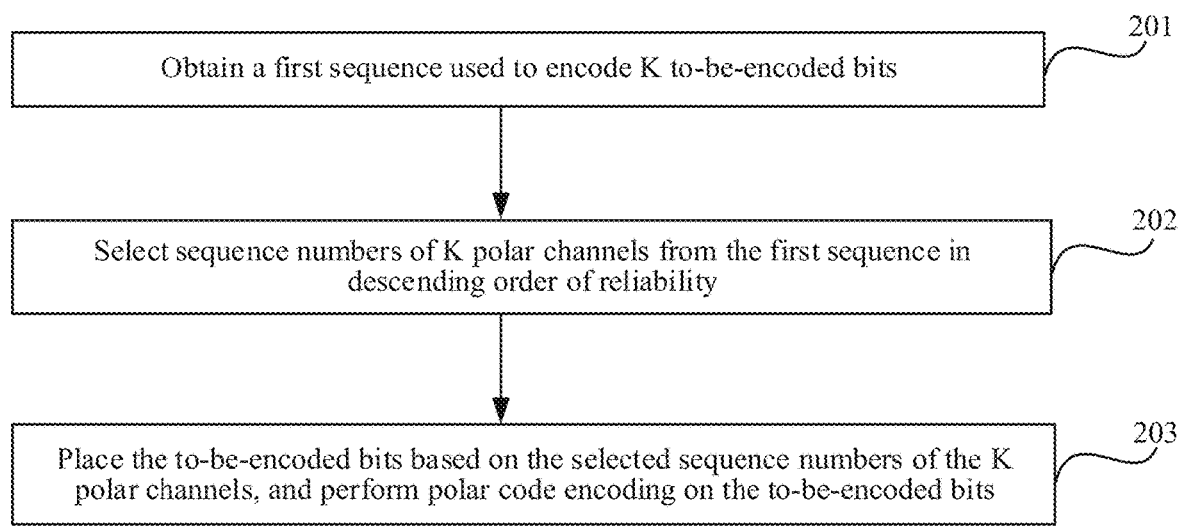
FIG. 2 is a schematic flowchart of a polar code encoding method according to an embodiment of this application.

Based on the architecture of the communications system shown in FIG. 1, as shown in FIG. 2, a specific procedure of a polar code encoding method provided in an embodiment of this application is as follows:

Operation 201. Obtain a first sequence used to encode K to-be-encoded bits.

The first sequence includes sequence numbers of N polar channels, and the sequence numbers of the N polar channels are arranged in the first sequence based on reliability of the N polar channels, K is a positive integer, N is a mother code length of a polar code, and N is a positive integer that is a power of 2.

Operation 202. Select sequence numbers of K polar channels from the first sequence in descending order of the reliability.

Operation 203. Place the to-be-encoded bits based on the selected sequence numbers of the K polar channels, and perform polar code encoding on the to-be-encoded bits.

The K to-be-encoded bits are mapped onto the K polar channels in the N polar channels, where reliability of the K polar channels is higher than reliability of remaining (N−K) polar channels.

In one embodiment, the first sequence is a second sequence or a subset of a second sequence, the second sequence includes sequence numbers of $N_{max}$ polar channels, and the sequence numbers of the $N_{max}$ polar channels are arranged in the second sequence based on reliability of the $N_{max}$ polar channels, where $N_{max}$ is a positive integer that is a power of 2, and $N_{max} \leq N$. A manner of computing the reliability of the $N_{max}$ polar channels is similar to a manner of computing the reliability of the N polar channels.

In one embodiment, based on a target code length, rate matching is performed on the sequence obtained after the polar code encoding.

In the encoding method provided in this embodiment, after the input information bits are received, the quantity K of the to-be-encoded bits is determined based on the target code length N of the polar code. Regardless of an online computation manner or a manner of pre-computation plus storage, if the second sequence is known, the first sequence may be obtained from the second sequence. When $N_{max}=N$, the second sequence is the first sequence. The second sequence includes reliability sorting of the $N_{max}$ polar channels, where $N_{max}$ is a maximum code length supported by the communications system. In one embodiment, the first sequence may be obtained from the pre-stored second sequence. Then, the information bits are determined based on the first sequence. Finally, polar encoding is performed on the K to-be-encoded bits, to obtain the bit sequence obtained after the polar encoding. In this way, locations of the information bits and fixed bits are determined by obtaining reliability of a polar channel of a polar code through a semi-online computation and semi-offline storage manner.

The following specifically describes how to determine reliability of an $i^{th}$ polar channel in the N (or $N_{max}$) polar channels. The sequence numbers of the N polar channels may be 0 to N−1, or may be 1 to N. In this embodiment of this application, when the reliability of the $i^{th}$ polar channel in the N polar channels is determined, a value of i may be 1, 2, . . . , or N, or may be 0, 1, . . . , or N−1.

The reliability of the $i^{th}$ polar channel in the N polar channels is represented by $W_i$, and reliability computation formulas may include but are not limited to the following several formulas. It may be understood that, the formulas used in this embodiment of this application are merely examples. A solution obtained by persons skilled in the art by simply transforming the formulas without affecting performance of the formulas shall fall within the protection scope of this embodiment of this application.

In the following formulas, without loss of generality, $0 \leq i \leq N-1$; $W_i$ is the reliability of the $i^{th}$ polar channel; $N=2^n$; i meets $i=B_{n-1}B_{n-2} \ldots B_0$, where $B_{n-1}B_{n-2} \ldots B_1B_0$ is a binary representation of i; and $B_j$ is a value of a $j^{th}$ bit in the binary representation of the channel sequence number i, where $B_j \in \{0,1\}$. In one embodiment, a value range of the polar channel sequence number i may also be selected as $1 \leq i \leq N$. In this case, $i-1=B_{n-1}B_{n-2} \ldots B_0$, that is, $B_{n-1}B_{n-2} \ldots B_1B_0$ is a binary representation of i−1. Other attributes and a sequence between various polar channels remain unchanged. Therefore, in this application, $0 \leq i \leq N-1$ is still used as an example for description.

The reliability $W_i$ of the $i^{th}$ polar channel is:

$$W_i = \sum_{(j=0)}^{n-1} B_j \times (\beta^j + a_0 \times b_0^j + B_{e1} \times a_1 \times b_1^j + B_{e2} \times a_2 \times b_2^j + \ldots) \quad (1)$$

where $\beta$ is usually a kernel function used for computing a polarization weight, for example, $\beta$ is set to $2^{1/4}$; $b_0$, $b_1$, and $b_2$ are different kernel functions, and values of $b_0$, $b_1$, and $b_2$ may be taken in a complex domain; $a_0$, $a_1$, and $a_2$ are weighting factors of corresponding kernel functions, and represent relative magnitude of impact of the kernel functions on a final polarization weight; $B_{e1}$ and $B_{e2}$ respectively indicate that kernel functions in corresponding products have impact on the polarization weight when an $e_1^{th}$ bit and an $e_2^{th}$ bit in the binary representation of the channel sequence number are 1. The kernel function herein describes a mapping relationship from one space to another space. In one embodiment, $\beta$, $b_1$, $b_2$, and the like constrain a mapping relationship from a channel sequence number domain to a reliability domain, and complete transformation from the channel sequence number domain to the reliability domain, and therefore are referred to as kernel functions. In embodiments of the present invention, an example is used for a specific mathematical form (for example, a numerical value) of the kernel function, and in an actual application, the numerical value may be expressed as a constant.

When the kernel function includes an imaginary part (a non-real number), final sorting in the sequence is performed based on a computed amplitude of a polarization weight. If two terms having a same amplitude are included, sorting is performed in ascending order of phases within $$[-\frac{\pi}{2}, \frac{\pi}{2}].$$

In one embodiment, sorting may alternatively be performed in descending order. This is not specifically limited herein. Without loss of generality, for a sequence in this application, sorting is still performed in ascending order.

For example, the formula (1) may include only four kernel functions:

$$W_i = \sum_{(j=0)}^{n-1} B_j \times (\beta^j + a_0 \times b_0^j + B_{e1} \times a_1 \times b_1^j + B_{e2} \times a_2 \times b_2^j) \quad (2)$$

Based on the formula (2), when the weighting factor and the complex kernel function are respectively $a_0=0.169$, $b_0=0.8805$, $a_1=-0.096$, $b_1=0.2432+0.2432I$, where I is an imaginary unit, $e_1=6$, $a_2=0.038$, $b_2=0.8262$, and $e_2=9$, the formula is:

$$W_i = \quad (3)$$
$$\sum_{(j=0)}^{n-1} B_j \times (\beta^j + 0.169 \times 0.8805^j - B_6 \times 0.096 \times (0.2432 + 0.2432I)^j +$$
$$B_9 \times 0.038 \times 0.8262^j)$$

Herein, it should be noted that, for example, when $N=128$, $n=7$. In this case, $n-1<e_2$, and $B_{e2}$ may be set to 0. For example, when $N=32$, $n=5$. In this case, $n-1<e_1$, and $B_{e1}$ and $B_{e2}$ may both be set to 0. That is, when $e_2>n-1$, $B_{e2}=0$, and when $e_1>n-1$, $B_{e1}=0$. The following formulas are similar, and details are not described again.

Based on the formula (2), when the weighting factor and the complex kernel function are respectively $a_0=0.1733$, $b_0=0.5486$, $a_1=-0.0279$, $b_1=0.5222+0.5222I$, where I is an imaginary unit, $e_1=5$, $a_2=-0.07$, $b_2=0$, and $e_2=6$, the formula is embodied as:

$$W_i = \sum_{(j=0)}^{n-1} B_j \times (\beta^j + 0.1733 \times 0.5486^j - \quad (4)$$
$$B_5 \times 0.0279 \times (0.5222 + 0.5222I)^j - B_6 \times 0.07 \times 0^j)$$

It should be noted that herein $b_2=0$ indicates that the kernel function produces a weight only for a least-significant bit of binary bits of a channel sequence number (where let $0^0=1$, and the same below).

For example, the formula (1) may further include only three kernel functions:

$$W_i = \sum_{(j=0)}^{n-1} B_j \times (\beta^j + a_0 \times b_0^j + B_{e1} \times a_1 \times b_1^j) \quad (5)$$

Based on the formula (5), when the weighting factors and the complex kernel functions are respectively $a_0=0.169$, $b_0=0.601$, $a_1=-0.07694$, $b_1=0.0769+0.0769I$, where I is an imaginary unit, and $e_1=6$, the formula is embodied as:

$$W_i = \sum_{(j=0)}^{n-1} B_j \times \quad (6)$$
$$(\beta^j + 0.169 \times 0.601^j - B_6 \times -0.07694 \times (0.0769 + 0.0769I)^j)$$

Based on the formula (5), when the weighting factors and the complex kernel functions are respectively $a_0=0.169$, $b_0=0.601$, $a_1=-0.0475$, $b_1=0$, and $e_1=6$, the formula is embodied as:

$$W_i = \sum_{(j=0)}^{n-1} B_j \times (\beta^j + 0.169 \times 0.601^j - B_6 \times 0.0475 \times 0^j) \quad (7)$$

For a specific example of the sequence, refer to the following sequence 1 to sequence 20.

Sequence 1:

Using $N=1024$ as an example, a sequence generated by using the formula (3) is:

[0, 1, 2, 4, 8, 16, 32, 3, 5, 6, 64, 9, 10, 17, 12, 128, 18, 33, 20, 34, 24, 65, 36, 7, 256, 66, 40, 11, 68, 13, 48, 129, 19, 14, 72, 130, 21, 512, 35, 132, 22, 80, 25, 37, 257, 136, 26, 67, 38, 96, 258, 41, 28, 69, 144, 42, 260, 49, 70, 73, 44, 15, 264, 160, 50, 131, 74, 513, 81, 52, 133, 23, 272, 514, 76, 134, 82, 192, 56, 516, 137, 27, 97, 39, 288, 84, 259, 138, 29, 520, 98, 145, 43, 261, 140, 30, 88, 71, 146, 100, 528, 262, 320, 45, 265, 161, 51, 148, 75, 46, 104, 266, 162, 53, 544, 77, 273, 152, 515, 83, 268, 193, 164, 54, 112, 135, 384, 274, 57, 78, 517, 85, 194, 289, 168, 58, 276, 576, 139, 518, 99, 521, 290, 86, 89, 196, 60, 141, 31, 280, 101, 176, 522, 321, 147, 292, 263, 142, 90, 200, 529, 524, 102, 105, 149, 640, 322, 530, 47, 296, 92, 267, 163, 150, 208, 106, 153, 545, 532, 324, 113, 269, 165, 55, 304, 79, 385, 546, 275, 154, 108, 195, 270, 536, 328, 166, 114, 224, 386, 577, 169, 548, 59, 277, 156, 768, 87, 197, 519, 116, 291, 170, 388, 278, 336, 61, 578, 552, 281, 177, 91, 198, 523, 201, 293, 172, 62, 120, 143, 392, 282, 580, 103, 178, 323, 294, 525, 560, 93, 352, 202, 641, 297, 284, 531, 209, 180, 584, 107, 526, 325, 151, 400, 642, 298, 94, 204, 533, 210, 109, 305, 184, 326, 644, 155, 329, 592, 115, 300, 547, 534, 225, 271, 167, 416, 537, 306, 212, 387, 110, 157, 549, 648, 330, 769, 117, 226, 538, 337, 308, 579, 171, 389, 279, 158, 608, 550, 216, 770, 199, 332, 553, 540, 118, 121, 228, 390, 656, 338, 448, 173, 63, 581, 312, 772, 393, 283, 554, 179, 353, 203, 295, 174, 122, 232, 340, 561, 394, 582, 585, 285, 556, 776, 181, 672, 95, 354, 205, 401, 527, 562, 124, 211, 299, 396, 643, 286, 344, 182, 327, 586, 240, 402, 593, 185, 356, 564, 206, 784, 645, 301, 213, 535, 111, 588, 417, 307, 186, 404, 331, 704, 227, 646, 594, 302, 360, 568, 649, 418, 214, 217, 609, 539, 309, 188, 800, 159, 333, 408, 119, 229, 596, 551, 650, 339, 771, 449, 420, 310, 541, 368, 391, 218, 610, 657, 313, 334, 652, 773, 123, 230, 600, 233, 341, 555, 542, 450, 658, 175, 424, 583, 314, 220, 612, 395, 832, 355, 774, 125, 557, 777, 234, 342, 345, 452, 673, 660, 316, 241, 563, 397, 287, 587, 616, 183, 357, 558, 432, 207, 778, 403, 674, 126, 236, 398, 346, 565, 664, 456, 785, 242, 589, 780, 705, 358, 187, 361, 405, 676, 595, 896, 624, 566, 786, 215, 303, 647, 348, 569, 244, 419, 590, 406, 464, 189, 706, 597, 362, 680, 409, 801, 788, 570, 369, 219, 651, 421, 611, 311, 190, 335, 248, 410, 802, 231, 708, 598, 364, 451, 601, 572, 792, 422, 370, 653, 221, 688, 480, 613, 543, 833, 425, 315, 412, 804, 659, 235, 712, 343, 453, 654, 602, 775, 372, 426, 222, 614, 317, 617, 834, 661, 808, 127, 237, 433, 604, 347, 454, 559, 457, 779, 243, 720, 428, 318, 675, 662, 376, 399, 359, 836, 618, 434, 665, 625, 238, 781, 816, 349, 458, 677, 245, 897, 567, 666, 465, 787, 591, 436, 620, 363, 840, 707, 782, 407, 736, 678, 626, 898, 350, 460, 681, 668, 246, 249, 789, 571, 466, 191, 365, 440, 709, 599, 411, 900, 628, 848, 371, 682, 481, 803, 790, 423, 573, 250, 793, 468, 689, 366, 710, 413, 713, 684, 603, 805, 904, 373, 632, 223, 574, 482, 794, 655, 690, 615, 252, 835, 427, 414, 864, 472, 806, 455, 714, 605, 809, 796, 374, 721, 377, 484, 692, 912, 429, 319, 837, 619, 663, 239, 810, 435, 716, 459, 606, 430, 722, 378, 488, 696, 817, 621, 838, 841, 812, 737, 667, 437, 627, 351, 928, 461, 247, 783, 818, 724, 380, 679, 467, 899, 438, 622, 496, 842, 669, 738, 629, 441, 849, 820, 462, 251, 901, 728, 469, 683, 670, 791, 367, 844, 442, 711, 740, 960, 483, 630, 902, 633, 850, 824, 253, 685, 905, 470, 473, 575, 865, 795, 444, 691, 415, 715, 375, 744, 485, 852, 686, 634, 807, 906, 254, 797, 474, 866, 693, 913, 717, 607, 908, 379, 486, 636, 489, 856, 723, 811, 798, 752, 694, 431, 914, 839, 476, 868, 697, 718, 381, 813, 725, 490, 929, 916, 497, 698, 819, 623, 843, 872, 439, 739, 814, 463, 930, 382, 492, 726, 729, 700, 821, 920, 498, 845, 741, 671, 961, 443, 631, 932, 851, 880, 822, 471, 730, 903, 825, 500, 846, 445, 742, 745, 962, 853, 635, 936, 255, 826, 475, 732, 687, 907, 446, 867, 504, 487, 964, 746, 637, 854, 857, 828, 753, 477, 909, 944, 869, 799, 695, 915, 719, 748, 491, 968, 638, 910, 858, 754, 478, 870, 873, 917, 699, 383, 493, 860, 727, 815, 756, 499, 976, 931, 918, 874, 701, 921, 881, 494, 731, 933, 501, 760, 702, 823, 922, 847, 876, 743, 963, 992, 934, 882, 733, 502, 937, 924, 505, 827, 447, 965, 747, 855, 884, 938, 734, 829, 506, 945, 749, 966, 969, 639, 940, 859, 888, 479, 755, 830, 911, 946, 871, 508, 750, 970, 861, 757, 977, 948, 875, 919, 495, 972, 862, 758, 761, 978, 952, 877, 703, 993, 923, 883, 503, 980, 762, 935, 878, 925, 994, 885, 735, 507, 764, 984, 939, 926, 967, 996, 886, 889, 509, 941, 831, 947, 751, 971, 1000, 942, 890, 510, 949, 973, 863, 892, 759, 979, 1008, 950, 953, 974, 981, 763, 954, 879, 995, 765, 982, 985, 956, 997, 927, 887, 766, 986, 998, 1001, 891, 511, 988, 943, 1002, 893, 1009, 951, 975, 1004, 894, 1010, 955, 983, 1012, 957, 767, 1016, 958, 999, 989, 1003, 990, 1005, 895, 1011, 1006, 1013, 1014, 1017, 959, 1018, 991, 1020, 1007, 1015, 1019, 1021, 1022, 1023].

Sequence 2:

Using N=1024 as an example, a sequence generated by using the formula (4) is:

[1, 2, 3, 5, 9, 17, 33, 4, 6, 7, 65, 10, 11, 18, 13, 129, 19, 34, 21, 35, 25, 257, 37, 8, 66, 67, 41, 12, 69, 14, 130, 49, 20, 15, 73, 513, 131, 22, 133, 36, 23, 81, 26, 258, 38, 137, 27, 259, 39, 97, 68, 42, 29, 145, 261, 70, 43, 50, 71, 265, 45, 16, 74, 514, 161, 132, 51, 75, 515, 134, 273, 53, 24, 82, 77, 517, 135, 193, 83, 138, 57, 28, 289, 260, 40, 98, 521, 139, 85, 30, 146, 262, 99, 141, 44, 31, 89, 529, 147, 263, 321, 101, 72, 266, 46, 162, 149, 52, 267, 47, 105, 545, 76, 516, 163, 274, 54, 153, 269, 385, 78, 518, 165, 136, 275, 194, 55, 113, 84, 58, 79, 519, 577, 290, 195, 277, 522, 169, 140, 86, 59, 291, 197, 100, 523, 87, 142, 281, 61, 32, 90, 530, 177, 148, 293, 264, 322, 102, 525, 143, 201, 641, 91, 531, 150, 323, 103, 297, 268, 48, 106, 546, 164, 93, 533, 151, 209, 325, 154, 270, 107, 547, 386, 166, 305, 276, 56, 114, 537, 155, 271, 329, 769, 109, 549, 387, 80, 520, 167, 578, 225, 196, 278, 115, 170, 157, 60, 579, 389, 292, 553, 279, 198, 524, 337, 171, 117, 88, 282, 62, 178, 581, 294, 199, 393, 526, 173, 144, 283, 202, 642, 63, 121, 561, 92, 532, 179, 295, 353, 324, 104, 527, 585, 298, 203, 643, 285, 401, 94, 534, 181, 152, 210, 326, 299, 205, 108, 645, 548, 95, 535, 593, 306, 211, 538, 327, 185, 156, 301, 272, 330, 770, 417, 110, 550, 388, 168, 307, 226, 649, 213, 116, 539, 158, 331, 771, 111, 551, 609, 580, 390, 227, 309, 554, 280, 338, 172, 118, 541, 159, 217, 657, 333, 773, 391, 449, 582, 229, 555, 200, 339, 394, 119, 174, 313, 284, 64, 122, 562, 180, 583, 296, 354, 777, 557, 395, 528, 341, 175, 586, 233, 673, 204, 644, 286, 123, 563, 402, 182, 355, 587, 397, 300, 287, 206, 646, 345, 785, 125, 565, 403, 96, 536, 183, 594, 241, 212, 357, 328, 186, 589, 302, 207, 647, 705, 418, 595, 405, 308, 650, 569, 214, 540, 187, 303, 361, 801, 332, 772, 419, 112, 552, 610, 228, 651, 597, 310, 215, 409, 542, 189, 160, 218, 658, 334, 774, 611, 421, 392, 450, 311, 230, 653, 556, 369, 340, 120, 543, 601, 314, 219, 659, 335, 775, 833, 613, 451, 584, 231, 778, 425, 558, 396, 342, 176, 315, 234, 674, 221, 124, 661, 564, 453, 356, 779, 559, 617, 343, 588, 398, 235, 675, 317, 288, 346, 786, 433, 126, 566, 404, 184, 242, 665, 358, 781, 399, 457, 897, 590, 237, 677, 208, 648, 347, 787, 706, 127, 567, 625, 596, 406, 243, 570, 359, 188, 591, 304, 362, 802, 707, 420, 349, 789, 681, 407, 652, 465, 598, 245, 571, 216, 410, 190, 363, 803, 709, 612, 422, 599, 312, 654, 370, 793, 573, 411, 544, 191, 602, 249, 689, 220, 660, 365, 805, 336, 776, 423, 834, 481, 614, 452, 232, 655, 371, 713, 426, 603, 413, 316, 222, 662, 835, 615, 809, 454, 780, 427, 560, 373, 618, 344, 236, 676, 605, 318, 223, 663, 721, 434, 837, 666, 455, 782, 619, 429, 400, 458, 898, 319, 238, 678, 377, 817, 348, 788, 435, 128, 568, 626, 244, 667, 360, 783, 841, 621, 459, 899, 592, 239, 679, 737, 708, 350, 790, 627, 437, 682, 408, 466, 246, 669, 572, 461, 364, 901, 804, 351, 791, 710, 849, 683, 629, 467, 600, 247, 794, 441, 574, 412, 192, 250, 690, 366, 806, 711, 424, 482, 905, 685, 656, 469, 372, 795, 714, 575, 633, 604, 414, 251, 691, 367, 807, 865, 836, 483, 616, 810, 715, 428, 374, 797, 415, 473, 913, 606, 253, 693, 224, 664, 722, 838, 485, 811, 456, 375, 717, 620, 430, 607, 320, 378, 818, 723, 436, 839, 697, 668, 813, 784, 431, 842, 489, 929, 622, 460, 900, 240, 680, 379, 819, 738, 725, 628, 438, 670, 843, 623, 462, 902, 739, 381, 821, 352, 792, 439, 850, 684, 497, 630, 468, 248, 671, 729, 442, 845, 463, 903, 961, 741, 712, 851, 906, 631, 686, 825, 470, 796, 443, 576, 634, 252, 692, 368, 808, 866, 484, 907, 853, 687, 745, 471, 716, 798, 635, 445, 416, 474, 914, 254, 694, 867, 486, 909, 812, 376, 799, 718, 857, 637, 475, 915, 608, 255, 695, 753, 724, 869, 840, 698, 487, 814, 719, 432, 490, 930, 477, 380, 917, 820, 726, 699, 815, 873, 844, 491, 931, 624, 740, 382, 822, 727, 440, 498, 921, 701, 672, 730, 846, 493, 933, 464, 904, 962, 383, 823, 742, 881, 852, 499, 632, 826, 731, 444, 847, 963, 743, 937, 908, 854, 688, 501, 827, 746, 472, 733, 636, 446, 965, 868, 855, 910, 747, 829, 800, 447, 858, 505, 945, 638, 476, 916, 256, 696, 754, 870, 488, 911, 969, 749, 720, 859, 639, 478, 918, 755, 871, 700, 816, 874, 492, 932, 861, 479, 919, 977, 757, 728, 922, 702, 875, 494, 934, 384, 824, 882, 500, 923, 703, 761, 732, 877, 848, 495, 935, 993, 964, 744, 883, 938, 502, 925, 828, 734, 966, 939, 885, 856, 503, 748, 830, 735, 448, 506, 946, 967, 941, 912, 970, 831, 750, 889, 860, 507, 947, 640, 756, 872, 971, 751, 862, 509, 949, 480, 920, 978, 758, 973, 876, 863, 979, 759, 953, 924, 704, 762, 878, 496, 936, 994, 981, 884, 926, 763, 879, 995, 940, 886, 504, 927, 985, 765, 736, 997, 968, 887, 942, 832, 890, 508, 948, 943, 1001, 972, 752, 891, 510, 950, 974, 893, 864, 511, 951, 1009, 980, 760, 954, 975, 982, 955, 764, 880, 996, 983, 957, 928, 986, 766, 998, 888, 987, 767, 999, 944, 1002, 989, 892, 1003, 894, 512, 952, 1010, 1005, 976, 895, 1011, 956, 1013, 984, 958, 959, 1017, 988, 768, 1000, 990, 1004, 991, 1006, 896, 1012, 1007, 1014, 1015, 960, 1018, 1019, 1021, 992, 1008, 1016, 1020, 1022, 1023, 1024].

Sequence 3:

Using N=1024 as an example, a sequence generated by using the formula (6) is:

[0, 1, 2, 4, 8, 16, 32, 3, 5, 6, 64, 9, 10, 17, 12, 128, 18, 33, 20, 34, 24, 36, 65, 7, 256, 66, 40, 11, 68, 13, 48, 129, 19, 14, 72, 130, 512, 21, 35, 132, 22, 80, 25, 37, 257, 136, 26, 38, 67, 96, 258, 41, 28, 144, 69, 42, 260, 49, 70, 44, 73, 15, 264, 160, 50, 131, 513, 74, 52, 81, 133, 514, 23, 272, 76, 134, 192, 82, 516, 56, 137, 27, 97, 39, 288, 84, 259, 138, 520, 29, 145, 98, 43, 261, 140, 30, 88, 146, 71, 528, 100, 262, 320, 45, 265, 161, 51, 148, 46, 75, 104, 266, 162, 544, 53, 515, 273, 152, 77, 268, 164, 54, 193, 83, 112, 135, 384, 274, 517, 57, 78, 85, 194, 518, 289, 168, 58, 276, 576, 139, 521, 99, 290, 196, 86, 60, 89, 141, 522, 31, 280, 176, 147, 101, 292, 529, 321, 263, 142, 200, 90, 524, 640, 149, 530, 102, 105, 322, 47, 296, 92, 267, 163, 150, 208, 545, 532, 153, 106, 324, 269, 113, 165, 546, 55, 304, 385, 275, 154, 79, 536, 108, 270, 328, 166, 195, 224, 114, 548, 386, 577, 519, 169, 768, 59, 277, 156, 197, 87, 116, 291, 170, 388, 278, 578, 336, 552, 61, 523, 281, 177, 198, 293, 172, 62, 201, 580, 91, 120, 143, 392, 282, 525, 178, 103, 560, 294, 641, 531, 323, 352, 93, 202, 526, 297, 284, 584, 180, 209, 642, 151, 400, 533, 107, 325, 298, 204, 94, 210, 547, 644, 534, 305, 184, 592, 155, 109, 326, 300, 537, 329, 271, 225, 115, 167, 416, 306, 212, 549, 387, 769, 648, 157, 538, 110, 330, 117, 226, 550, 308, 579, 608, 337, 171, 389, 770, 279, 158, 216, 553, 540, 332, 199, 656, 228, 118, 390, 581, 121, 448, 338, 173, 554, 772, 63, 312, 393, 283, 179, 561, 353, 295, 174, 203, 582, 232, 122, 340, 556, 394, 585, 527, 776, 285, 672, 181, 562, 643, 401, 354, 205, 95, 124, 299, 396, 286, 586, 344, 182, 211, 240, 564, 402, 593, 645, 535, 185, 327, 784, 356, 206, 301, 588, 213, 646, 417, 307, 186, 404, 704, 594, 111, 568, 302, 649, 539, 331, 360, 227, 418, 609, 214, 551, 800, 309, 188, 217, 596, 771, 650, 159, 408, 541, 333, 229, 119, 420, 310, 657, 449, 610, 339, 368, 391, 218, 555, 773, 652, 542, 313, 600, 334, 658, 230, 583, 233, 612, 123, 341, 450, 175, 774, 424, 314, 832, 220, 557, 395, 777, 673, 563, 660, 355, 125, 234, 452, 342, 558, 316, 587, 616, 345, 397, 778, 287, 241, 674, 183, 432, 565, 403, 357, 207, 785, 664, 236, 126, 398, 589, 456, 346, 780, 242, 676, 566, 705, 595, 624, 647, 896, 187, 405, 786, 358, 569, 361, 303, 590, 348, 215, 244, 419, 406, 597, 706, 464, 801, 680, 189, 570, 788, 651, 409, 362, 611, 369, 421, 802, 311, 190, 708, 219, 598, 248, 572, 410, 601, 653, 543, 335, 792, 364, 231, 688, 422, 659, 613, 451, 480, 370, 804, 833, 221, 775, 654, 425, 315, 412, 712, 602, 661, 235, 453, 614, 343, 372, 426, 617, 834, 222, 559, 808, 317, 604, 779, 675, 662, 433, 720, 237, 127, 454, 428, 318, 665, 457, 618, 836, 347, 376, 399, 243, 781, 434, 625, 677, 567, 359, 816, 897, 787, 666, 238, 591, 620, 349, 458, 782, 840, 245, 678, 436, 707, 736, 465, 626, 898, 407, 681, 571, 789, 668, 363, 460, 350, 246, 709, 599, 249, 628, 466, 803, 682, 900, 191, 790, 440, 848, 573, 411, 365, 793, 689, 481, 371, 423, 710, 250, 468, 805, 684, 574, 713, 603, 632, 655, 904, 413, 794, 366, 690, 615, 373, 482, 806, 835, 223, 864, 252, 427, 414, 605, 714, 472, 809, 796, 692, 721, 663, 455, 912, 484, 374, 619, 837, 377, 429, 810, 319, 716, 606, 435, 722, 239, 817, 696, 430, 667, 621, 459, 838, 488, 378, 812, 841, 783, 737, 627, 679, 928, 437, 818, 724, 899, 669, 461, 622, 351, 380, 842, 247, 438, 629, 738, 467, 496, 820, 849, 683, 901, 791, 670, 441, 728, 462, 844, 711, 740, 251, 469, 630, 902, 442, 633, 960, 850, 685, 575, 367, 824, 905, 795, 691, 483, 865, 253, 470, 807, 686, 444, 715, 744, 473, 634, 852, 906, 415, 797, 693, 485, 375, 913, 866, 254, 717, 607, 636, 474, 811, 908, 798, 856, 694, 723, 752, 914, 486, 697, 839, 489, 868, 379, 431, 718, 476, 813, 725, 929, 819, 698, 916, 623, 381, 490, 814, 843, 872, 739, 497, 930, 439, 726, 821, 700, 729, 671, 463, 920, 492, 382, 845, 741, 631, 498, 932, 822, 961, 851, 880, 903, 443, 730, 825, 846, 742, 471, 500, 745, 635, 853, 962, 687, 936, 445, 826, 732, 907, 867, 255, 446, 637, 746, 964, 475, 854, 504, 828, 857, 909, 799, 753, 695, 487, 944, 915, 869, 719, 748, 477, 638, 910, 968, 858, 754, 699, 917, 491, 870, 873, 478, 815, 860, 727, 756, 931, 918, 976, 701, 493, 383, 921, 874, 499, 881, 933, 823, 702, 731, 760, 922, 494, 847, 876, 743, 501, 934, 963, 992, 882, 733, 937, 827, 924, 502, 747, 965, 855, 505, 884, 938, 447, 734, 829, 945, 749, 639, 966, 506, 940, 830, 969, 859, 888, 911, 755, 946, 871, 750, 479, 508, 861, 970, 757, 948, 977, 919, 875, 972, 862, 758, 761, 978, 703, 495, 952, 923, 877, 993, 883, 935, 762, 980, 925, 878, 503, 885, 994, 735, 764, 939, 926, 984, 967, 996, 507, 886, 889, 941, 831, 947, 751, 509, 942, 971, 1000, 890, 949, 510, 973, 863, 892, 759, 950, 979, 1008, 953, 974, 763, 981, 954, 879, 995, 765, 982, 956, 985, 927, 997, 887, 766, 986, 998, 1001, 891, 943, 988, 511, 893, 1002, 1009, 951, 975, 1004, 894, 1010, 955, 983, 1012, 957, 767, 958, 987, 1016, 999, 989, 1003, 990, 1005, 895, 1011, 1006, 1013, 1014, 1017, 959, 1018, 991, 1020, 1007, 1015, 1019, 1021, 1022, 1023].

Sequence 4:

Using N=1024 as an example, a sequence generated by using the formula (7) is:

[0, 1, 2, 4, 8, 16, 32, 3, 5, 6, 64, 9, 10, 17, 12, 128, 18, 33, 20, 34, 24, 65, 36, 7, 256, 66, 40, 11, 68, 13, 48, 129, 19, 14, 72, 130, 512, 21, 35, 132, 22, 80, 25, 37, 257, 136, 26, 67, 38, 96, 258, 41, 28, 144, 69, 42, 260, 49, 70, 73, 44, 15, 264, 160, 50, 131, 513, 74, 81, 52, 133, 514, 23, 272, 76, 134, 192, 82, 516, 56, 137, 27, 97, 39, 288, 84, 259, 138, 520, 29, 145, 98, 43, 261, 140, 30, 88, 146, 71, 528, 100, 262, 320, 45, 265, 161, 51, 148, 75, 46, 104, 266, 162, 544, 53, 515, 273, 152, 77, 268, 193, 83, 164, 54, 112, 135, 384, 274, 517, 57, 78, 85, 194, 518, 289, 168, 58, 276, 576, 139, 521, 99, 290, 196, 86, 89, 60, 141, 522, 31, 280, 176, 101, 147, 321, 292, 529, 263, 142, 200, 90, 524, 640, 149, 530, 102, 105, 322, 47, 296, 92, 267, 163, 150, 208, 545, 532, 153, 106, 324, 113, 269, 165, 546, 55, 304, 385, 275, 154, 79, 536, 108, 270, 195, 328, 166, 224, 114, 577, 548, 386, 519, 169, 768, 59, 277, 156, 197, 87, 116, 291, 170, 388, 278, 578, 336, 552, 61, 523, 281, 177, 198, 201, 91, 293, 172, 62, 580, 120, 143, 392, 282, 525, 178, 103, 560, 323, 294, 641, 531, 352, 93, 202, 526, 297, 284, 584, 209, 180, 642, 151, 400, 107, 325, 533, 298, 204, 94, 210, 547, 644, 534, 305, 184, 109, 592, 155, 326, 329, 300, 537, 225, 115, 271, 167, 416, 306, 212, 549, 387, 769, 648, 157, 538, 110, 330, 117, 226, 579, 550, 337, 308, 608, 171, 389, 770, 279, 158, 216, 553, 540, 199, 332, 656, 228, 118, 581, 121, 390, 448, 338, 173, 554, 772, 63, 312, 393, 283, 179, 353, 561, 203, 295, 174, 582, 232, 122, 585, 340, 556, 394, 527, 776, 285, 672, 181, 562, 643, 401, 354, 205, 95, 124, 299, 396, 286, 586, 211, 344, 182, 240, 593, 564, 402, 327, 645, 535, 185, 784, 356, 206, 301, 588, 213, 646, 417, 307, 186, 404, 111, 704, 594, 568, 331, 302, 649, 539, 227, 360, 609, 418, 214, 551, 217, 800, 309, 188, 596, 771, 650, 159, 408, 333, 541, 229, 119, 449, 339, 420, 310, 657, 610, 368, 391, 218, 555, 773, 652, 542, 313, 600, 334, 658, 230, 583, 233, 123, 341, 612, 450, 175, 774, 424, 314, 832, 220, 557, 395, 777, 355, 673, 563, 660, 125, 234, 587, 452, 342, 558, 345, 316, 616, 241, 397, 778, 287, 674, 183, 432, 357, 565, 403, 207, 785, 664, 236, 126, 589, 398, 456, 346, 780, 242, 705, 595, 676, 566, 624, 647, 896, 187, 405, 786, 358, 361, 569, 303, 590, 215, 348, 244, 597, 419, 406, 706, 464, 801, 680, 189, 570, 788, 651, 409, 362, 611, 369, 219, 421, 802, 311, 190, 708, 598, 248, 601, 572, 410, 335, 653, 543, 792, 231, 364, 688, 613, 451, 422, 659, 480, 370, 833, 221, 804, 775, 654, 425, 315, 412, 712, 602, 235, 453, 343, 661, 614, 617, 372, 426, 834, 222, 559, 808, 317, 604, 779, 675, 662, 433, 237, 127, 720, 454, 457, 347, 428, 318, 665, 618, 836, 243, 376, 399, 625, 781, 434, 359, 677, 567, 816, 897, 787, 666, 238, 591, 349, 620, 458, 245, 782, 707, 840, 678, 465, 436, 736, 626, 898, 407, 363, 681, 571, 789, 668, 460, 350, 246, 709, 599, 249, 628, 466, 803, 682, 900, 191, 790, 440, 365, 848, 573, 411, 793, 481, 371, 689, 423, 710, 250, 713, 603, 468, 805, 684, 574, 632, 655, 904, 413, 794, 366, 690, 615, 373, 482, 835, 223, 806, 864, 252, 605, 427, 414, 714, 472, 809, 796, 721, 692, 455, 663, 912, 619, 484, 374, 837, 377, 429, 810, 319, 716, 606, 435, 239, 722, 817, 696, 621, 459, 430, 667, 838, 488, 378, 841, 812, 737, 627, 783, 679, 928, 437, 818, 724, 899, 461, 351, 669, 622, 247, 380, 842, 629, 467, 438, 738, 496, 849, 820, 683, 901, 791, 670, 441, 728, 462, 711, 844, 251, 469, 740, 630, 633, 902, 442, 367, 960, 850, 685, 575, 824, 905, 795, 483, 691, 865, 253, 715, 470, 807, 686, 473, 444, 744, 634, 852, 906, 415, 797, 485, 375, 693, 913, 866, 254, 717, 607, 636, 474, 811, 908, 798, 723, 856, 694, 752, 914, 486, 839, 489, 379, 697, 868, 431, 718, 476, 813, 725, 929, 819, 698, 916, 623, 381, 490, 843, 814, 739, 872, 497, 930, 439, 726, 729, 821, 700, 463, 671, 920, 492, 382, 845, 741, 631, 498, 961, 851, 932, 822, 880, 903, 443, 730, 825, 846, 471, 742, 745, 635, 500, 853, 962, 687, 936, 445, 826, 732, 907, 867, 255, 637, 475, 446, 746, 964, 854, 504, 857, 828, 753, 909, 799, 487, 695, 944, 869, 915, 719, 477, 748, 638, 910, 968, 858, 754, 491, 699, 917, 870, 873, 478, 815, 727, 860, 756, 931, 918, 493, 383, 976, 701, 921, 874, 499, 881, 731, 933, 823, 702, 760, 922, 494, 847, 743, 876, 501, 963, 934, 992, 882, 733, 937, 827, 924, 747, 502, 965, 855, 505, 884, 938, 447, 734, 829, 945, 749, 639, 966, 506, 969, 859, 940, 830, 755, 888, 911, 946, 871, 479, 750, 508, 861, 970, 757, 977, 948, 919, 875, 972, 862, 758, 761, 495, 978, 703, 952, 877, 923, 993, 883, 935, 762, 980, 925, 878, 503, 885, 994, 735, 764, 939, 926, 984, 967, 507, 996, 886, 889, 941, 831, 947, 751, 509, 971, 942, 1000, 890, 949, 510, 973, 863, 759, 892, 979, 950, 1008, 953, 974, 763, 981, 954, 879, 995, 765, 982, 985, 956, 927, 997, 887, 766, 986, 998, 1001, 891, 943, 988, 511, 893, 1002, 1009, 951, 975, 1004, 894, 1010, 955, 983, 1012, 957, 767, 987, 958, 1016, 999, 989, 1003, 990, 1005, 895, 1011, 1006, 1013, 1014, 1017, 959, 1018, 991, 1020, 1007, 1015, 1019, 1021, 1022, 1023].

Sequence 5:

Using N=512 as an example, a sequence generated by using the formula (3) is:

[0, 1, 2, 4, 8, 16, 32, 3, 5, 6, 64, 9, 10, 17, 12, 128, 18, 33, 20, 34, 24, 65, 36, 7, 256, 66, 40, 11, 68, 13, 48, 129, 19, 14, 72, 130, 21, 35, 132, 22, 80, 25, 37, 257, 136, 26, 67, 38, 96, 258, 41, 28, 69, 144, 42, 260, 49, 70, 73, 44, 15, 264, 160, 50, 131, 74, 81, 52, 133, 23, 272, 76, 134, 82, 192, 56, 137, 27, 97, 39, 288, 84, 259, 138, 29, 98, 145, 43, 261, 140, 30, 88, 71, 146, 100, 262, 320, 45, 265, 161, 51, 148, 75, 46, 104, 266, 162, 53, 77, 273, 152, 83, 268, 193, 164, 54, 112, 135, 384, 274, 57, 78, 85, 194, 289, 168, 58, 276, 139, 99, 290, 86, 89, 196, 60, 141, 31, 280, 101, 176, 321, 147, 292, 263, 142, 90, 200, 102, 105, 149, 322, 47, 296, 92, 267, 163, 150, 208, 106, 153, 324, 113, 269, 165, 55, 304, 79, 385, 275, 154, 108, 195, 270, 328, 166, 114, 224, 386, 169, 59, 277, 156, 87, 197, 116, 291, 170, 388, 278, 336, 61, 281, 177, 91, 198, 201, 293, 172, 62, 120, 143, 392, 282, 103, 178, 323, 294, 93, 352, 202, 297, 284, 209, 180, 107, 325, 151, 400, 298, 94, 204, 210, 109, 305, 184, 326, 155, 329, 115, 300, 225, 271, 167, 416, 306, 212, 387, 110, 157, 330, 117, 226, 337, 308, 171, 389, 279, 158, 216, 199, 332, 118, 121, 228, 390, 338, 448, 173, 63, 312, 393, 283, 179, 353, 203, 295, 174, 122, 232, 340, 394, 285, 181, 95, 354, 205, 401, 124, 211, 299, 396, 286, 344, 182, 327, 240, 402, 185, 356, 206, 301, 213, 111, 417, 307, 186, 404, 331, 227, 302, 360, 418, 214, 217, 309, 188, 159, 333, 408, 119, 229, 339, 449, 420, 310, 368, 391, 218, 313, 334, 123, 230, 233, 341, 450, 175, 424, 314, 220, 395, 355, 125, 234, 342, 345, 452, 316, 241, 397, 287, 183, 357, 432, 207, 403, 126, 236, 398, 346, 456, 242, 358, 187, 361, 405, 215, 303, 348, 244, 419, 406, 464, 189, 362, 409, 369, 219, 421, 311, 190, 335, 248, 410, 231, 364, 451, 422, 370, 221, 480, 425, 315, 412, 235, 343, 453, 372, 426, 222, 317, 127, 237, 433, 347, 454, 457, 243, 428, 318, 376, 399, 359, 434, 238, 349, 458, 245, 465, 436, 363, 407, 350, 460, 246, 249, 466, 191, 365, 440, 411, 371, 481, 423, 250, 468, 366, 413, 373, 223, 482, 252, 427, 414, 472, 455, 374, 377, 484, 429, 319, 239, 435, 459, 430, 378, 488, 437, 351, 461, 247, 380, 467, 438, 496, 441, 462, 251, 469, 367, 442, 483, 253, 470, 473, 444, 415, 375, 485, 254, 474, 379, 486, 489, 431, 476, 381, 490, 497, 439, 463, 382, 492, 498, 443, 471, 500, 445, 255, 475, 446, 504, 487, 477, 491, 478, 383, 493, 499, 494, 501, 502, 505, 447, 506, 479, 508, 495, 503, 507, 509, 510, 511]].

Sequence 6:

Using N=512 as an example, a sequence generated by using the formula (4) is:

[0, 1, 2, 4, 8, 16, 32, 3, 5, 6, 64, 9, 10, 17, 12, 128, 18, 33, 20, 34, 24, 65, 36, 256, 7, 66, 40, 11, 68, 13, 48, 129, 19, 14, 72, 130, 21, 35, 132, 22, 80, 25, 37, 136, 257, 26, 38, 67, 96, 258, 41, 28, 144, 69, 42, 260, 49, 70, 73, 44, 264, 15, 160, 50, 131, 74, 81, 52, 133, 272, 23, 76, 134, 192, 82, 56, 137, 27, 97, 39, 288, 84, 138, 259, 29, 98, 145, 43, 140, 261, 30, 88, 146, 71, 100, 262, 320, 45, 265, 161, 51, 148, 46, 75, 104, 266, 162, 53, 152, 273, 77, 268, 193, 164, 54, 83, 112, 384, 135, 274, 57, 78, 85, 289, 194, 168, 276, 58, 139, 99, 290, 196, 86, 89, 60, 141, 280, 31, 101, 176, 147, 321, 292, 142, 263, 200, 90, 102, 149, 105, 47, 322, 296, 92, 163, 267, 150, 208, 153, 106, 324, 113, 269, 165, 55, 304, 385, 154, 275, 79, 108, 270, 328, 166, 195, 224, 114, 386, 169, 59, 156, 277, 197, 87, 291, 116, 170, 388, 278, 336, 61, 281, 177, 293, 198, 201, 91, 172, 62, 120, 392, 143, 282, 103, 178, 294, 323, 352, 93, 202, 297, 284, 209, 180, 107, 400, 151, 325, 298, 204, 94, 210, 305, 109, 184, 155, 326, 329, 300, 225, 115, 167, 271, 416, 306, 212, 387, 157, 110, 330, 117, 226, 337, 171, 308, 389, 158, 279, 216, 332, 199, 228, 118, 121, 390, 173, 448, 63, 338, 312, 393, 283, 179, 353, 295, 174, 203, 232, 340, 122, 394, 285, 181, 354, 401, 205, 95, 299, 124, 396, 286, 344, 182, 211, 240, 402, 327, 185, 356, 206, 301, 213, 417, 307, 111, 186, 404, 302, 227, 331, 360, 418, 214, 309, 217, 188, 408, 159, 333, 229, 119, 449, 420, 310, 339, 368, 391, 218, 313, 334, 230, 233, 123, 341, 175, 450, 424, 314, 220, 395, 355, 125, 234, 452, 342, 345, 316, 241, 397, 287, 183, 357, 432, 403, 207, 236, 126, 398, 456, 346, 242, 187, 358, 405, 361, 303, 348, 215, 419, 244, 406, 464, 189, 409, 362, 369, 421, 311, 219, 190, 248, 410, 231, 335, 364, 422, 451, 480, 370, 221, 425, 315, 412, 235, 453, 343, 372, 426, 222, 317, 433, 237, 127, 454, 457, 428, 347, 318, 243, 376, 399, 359, 434, 238, 349, 458, 245, 465, 436, 363, 407, 460, 350, 246, 249, 191, 466, 365, 440, 411, 481, 371, 423, 250, 468, 413, 366, 373, 482, 223, 427, 252, 414, 472, 455, 484, 374, 377, 429, 319, 435, 239, 430, 459, 488, 378, 437, 461, 351, 247, 380, 438, 467, 496, 441, 462, 251, 469, 367, 442, 483, 253, 470, 473, 444, 415, 485, 375, 254, 474, 486, 489, 379, 431, 476, 381, 490, 497, 439, 463, 492, 382, 498, 443, 471, 500, 445, 255, 475, 446, 504, 487, 477, 491, 478, 493, 383, 499, 494, 501, 502, 505, 447, 506, 479, 508, 495, 503, 507, 509, 510, 511].

Sequence 7:

Using N=512 as an example, a sequence generated by using the formula (6) is:

[0, 1, 2, 4, 8, 16, 32, 3, 5, 6, 64, 9, 10, 17, 12, 128, 18, 33, 20, 34, 24, 36, 65, 7, 256, 66, 40, 11, 68, 13, 48, 129, 19, 14, 72, 130, 21, 35, 132, 22, 80, 25, 37, 257, 136, 26, 38, 67, 96, 258, 41, 28, 144, 69, 42, 260, 49, 70, 44, 73, 15, 264, 160, 50, 131, 74, 52, 81, 133, 23, 272, 76, 134, 192, 82, 56, 137, 27, 97, 39, 288, 84, 259, 138, 29, 145, 98, 43, 261, 140, 30, 88, 146, 71, 100, 262, 320, 45, 265, 161, 51, 148, 46, 75, 104, 266, 162, 53, 273, 152, 77, 268, 164, 54, 193, 83, 112, 135, 384, 274, 57, 78, 85, 194, 289, 168, 58, 276, 139, 99, 290, 196, 86, 60, 89, 141, 31, 280, 176, 147, 101, 292, 321, 263, 142, 200, 90, 149, 102, 105, 322, 47, 296, 92, 267, 163, 150, 208, 153, 106, 324, 269, 113, 165, 55, 304, 385, 275, 154, 79, 108, 270, 328, 166, 195, 224, 114, 386, 169, 59, 277, 156, 197, 87, 116, 291, 170, 388, 278, 336, 61, 281, 177, 198, 293, 172, 62, 201, 91, 120, 143, 392, 282, 178, 103, 294, 323, 352, 93, 202, 297, 284, 180, 209, 151, 400, 107, 325, 298, 204, 94, 210, 305, 184, 155, 109, 326, 300, 329, 271, 225, 115, 167, 416, 306, 212, 387, 157, 110, 330, 117, 226, 308, 337, 171, 389, 279, 158, 216, 332, 199, 228, 118, 390, 121, 448, 338, 173, 63, 312, 393, 283, 179, 353, 295, 174, 203, 232, 122, 340, 394, 285, 181, 401, 354, 205, 95, 124, 299, 396, 286, 344, 182, 211, 240, 402, 185, 327, 356, 206, 301, 213, 417, 307, 186, 404, 111, 302, 331, 360, 227, 418, 214, 309, 188, 217, 159, 408, 333, 229, 119, 420, 310, 449, 339, 368, 391, 218, 313, 334, 230, 233, 123, 341, 450, 175, 424, 314, 220, 395, 355, 125, 234, 452, 342, 316, 345, 397, 287, 241, 183, 432, 403, 357, 207, 236, 126, 398, 456, 346, 242, 187, 405, 358, 361, 303, 348, 215, 244, 419, 406, 464, 189, 409, 362, 369, 421, 311, 190, 219, 248, 410, 335, 364, 231, 422, 451, 480, 370, 221, 425, 315, 412, 235, 453, 343, 372, 426, 222, 317, 433, 237, 127, 454, 428, 318, 457, 347, 376, 399, 243, 434, 359, 238, 349, 458, 245, 436, 465, 407, 363, 460, 350, 246, 249, 466, 191, 440, 411, 365, 481, 371, 423, 250, 468, 413, 366, 373, 482, 223, 252, 427, 414, 472, 455, 484, 374, 377, 429, 319, 435, 239, 430, 459, 488, 378, 437, 461, 351, 380, 247, 438, 467, 496, 441, 462, 251, 469, 442, 367, 483, 253, 470, 444, 473, 415, 485, 375, 254, 474, 486, 489, 379, 431, 476, 381, 490, 497, 439, 463, 492, 382, 498, 443, 471, 500, 445, 255, 446, 475, 504, 487, 477, 491, 478, 493, 383, 499, 494, 501, 502, 505, 447, 506, 479, 508, 495, 503, 507, 509, 510, 511].

Sequence 8:

Using N=512 as an example, a sequence generated by using the formula (7) is:

[0, 1, 2, 4, 8, 16, 32, 3, 5, 6, 64, 9, 10, 17, 12, 128, 18, 33, 20, 34, 24, 65, 36, 7, 256, 66, 40, 11, 68, 13, 48, 129, 19, 14, 72, 130, 21, 35, 132, 22, 80, 25, 37, 257, 136, 26, 67, 38, 96, 258, 41, 28, 144, 69, 42, 260, 49, 70, 73, 44, 15, 264, 160, 50, 131, 74, 81, 52, 133, 23, 272, 76, 134, 192, 82, 56, 137, 27, 97, 39, 288, 84, 259, 138, 29, 145, 98, 43, 261, 140, 30, 88, 146, 71, 100, 262, 320, 45, 265, 161, 51, 148, 75, 46, 104, 266, 162, 53, 273, 152, 77, 268, 193, 83, 164, 54, 112, 135, 384, 274, 57, 78, 85, 194, 289, 168, 58, 276, 139, 99, 290, 196, 86, 89, 60, 141, 31, 280, 176, 101, 147, 321, 292, 263, 142, 200, 90, 149, 102, 105, 322, 47, 296, 92, 267, 163, 150, 208, 153, 106, 324, 113, 269, 165, 55, 304, 385, 275, 154, 79, 108, 270, 195, 328, 166, 224, 114, 386, 169, 59, 277, 156, 197, 87, 116, 291, 170, 388, 278, 336, 61, 281, 177, 198, 201, 91, 293, 172, 62, 120, 143, 392, 282, 178, 103, 323, 294, 352, 93, 202, 297, 284, 209, 180, 151, 400, 107, 325, 298, 204, 94, 210, 305, 184, 109, 155, 326, 329, 300, 225, 115, 271, 167, 416, 306, 212, 387, 157, 110, 330, 117, 226, 337, 308, 171, 389, 279, 158, 216, 199, 332, 228, 118, 121, 390, 448, 338, 173, 63, 312, 393, 283, 179, 353, 203, 295, 174, 232, 122, 340, 394, 285, 181, 401, 354, 205, 95, 124, 299, 396, 286, 211, 344, 182, 240, 402, 327, 185, 356, 206, 301, 213, 417, 307, 186, 404, 111, 331, 302, 227, 360, 418, 214, 217, 309, 188, 159, 408, 333, 229, 119, 449, 339, 420, 310, 368, 391, 218, 313, 334, 230, 233, 123, 341, 450, 175, 424, 314, 220, 395, 355, 125, 234, 452, 342, 345, 316, 241, 397, 287, 183, 432, 357, 403, 207, 236, 126, 398, 456, 346, 242, 187, 405, 358, 361, 303, 215, 348, 244, 419, 406, 464, 189, 409, 362, 369, 219, 421, 311, 190, 248, 410, 335, 231, 364, 422, 451, 480, 370, 221, 425, 315, 412, 235, 453, 343, 372, 426, 222, 317, 433, 237, 127, 454, 457, 347, 428, 318, 243, 376, 399, 434, 359, 238, 349, 458, 245, 465, 436, 407, 363, 460, 350, 246, 249, 466, 191, 440, 365, 411, 481, 371, 423, 250, 468, 413, 366, 373, 482, 223, 252, 427, 414, 472, 455, 484, 374, 377, 429, 319, 435, 239, 459, 430, 488, 378, 437, 461, 351, 247, 380, 467, 438, 496, 441, 462, 251, 469, 442, 367, 483, 253, 470, 473, 444, 415, 485, 375, 254, 474, 486, 489, 379, 431, 476, 381, 490, 497, 439, 463, 492, 382, 498, 443, 471, 500, 445, 255, 475, 446, 504, 487, 477, 491, 478, 493, 383, 499, 494, 501, 502, 505, 447, 506, 479, 508, 495, 503, 507, 509, 510, 511].

Sequence 9:

Using N=256 as an example, a sequence generated by using the formula (3) is:

[0, 1, 2, 4, 8, 16, 32, 3, 5, 6, 64, 9, 10, 17, 12, 128, 18, 33, 20, 34, 24, 65, 36, 7, 66, 40, 11, 68, 13, 48, 129, 19, 14, 72, 130, 21, 35, 132, 22, 80, 25, 37, 136, 26, 67, 38, 96, 41, 28, 69, 144, 42, 49, 70, 73, 44, 15, 160, 50, 131, 74, 81, 52, 133, 23, 76, 134, 82, 192, 56, 137, 27, 97, 39, 84, 138, 29, 98, 145, 43, 140, 30, 88, 71, 146, 100, 45, 161, 51, 148, 75, 46, 104, 162, 53, 77, 152, 83, 193, 164, 54, 112, 135, 57, 78, 85, 194, 168, 58, 139, 99, 86, 89, 196, 60, 141, 31, 101, 176, 147, 142, 90, 200, 102, 105, 149, 47, 92, 163, 150, 208, 106, 153, 113, 165, 55, 79, 154, 108, 195, 166, 114, 224, 169, 59, 156, 87, 197, 116, 170, 61, 177, 91, 198, 201, 172, 62, 120, 143, 103, 178, 93, 202, 209, 180, 107, 151, 94, 204, 210, 109, 184, 155, 115, 225, 167, 212, 110, 157, 117, 226, 171, 158, 216, 199, 118, 121, 228, 173, 63, 179, 203, 174, 122, 232, 181, 95, 205, 124, 211, 182, 240, 185, 206, 213, 111, 186, 227, 214, 217, 188, 159, 119, 229, 218, 123, 230, 233, 175, 220, 125, 234, 241, 183, 207, 126, 236, 242, 187, 215, 244, 189, 219, 190, 248, 231, 221, 235, 222, 127, 237, 243, 238, 245, 246, 249, 191, 250, 223, 252, 239, 247, 251, 253, 254, 255].

Sequence 10:

Using N=256 as an example, a sequence generated by using the formula (4) is:

[0, 1, 2, 4, 8, 16, 32, 3, 5, 6, 64, 9, 10, 17, 12, 128, 18, 33, 20, 34, 24, 65, 36, 7, 66, 40, 11, 68, 13, 48, 129, 19, 14, 72, 130, 21, 35, 132, 22, 80, 25, 37, 136, 26, 38, 67, 96, 41, 28, 144, 69, 42, 49, 70, 73, 44, 15, 160, 50, 131, 74, 81, 52, 133, 23, 76, 134, 192, 82, 56, 137, 27, 97, 39, 84, 138, 29, 98, 145, 43, 140, 30, 88, 146, 71, 100, 45, 161, 51, 148, 46, 75, 104, 162, 53, 152, 77, 193, 164, 54, 83, 112, 135, 57, 78, 85, 194, 168, 58, 139, 99, 196, 86, 89, 60, 141, 31, 101, 176, 147, 142, 200, 90, 102, 149, 105, 47, 92, 163, 150, 208, 153, 106, 113, 165, 55, 154, 79, 108, 166, 195, 224, 114, 169, 59, 156, 197, 87, 116, 170, 61, 177, 198, 201, 91, 172, 62, 120, 143, 103, 178, 93, 202, 209, 180, 107, 151, 204, 94, 210, 109, 184, 155, 225, 115, 167, 212, 157, 110, 117, 226, 171, 158, 216, 199, 228, 118, 121, 173, 63, 179, 174, 203, 232, 122, 181, 205, 95, 124, 182, 211, 240, 185, 206, 213, 111, 186, 227, 214, 217, 188, 159, 229, 119, 218, 230, 233, 123, 175, 220, 125, 234, 241, 183, 207, 236, 126, 242, 187, 215, 244, 189, 219, 190, 248, 231, 221, 235, 222, 237, 127, 243, 238, 245, 246, 249, 191, 250, 223, 252, 239, 247, 251, 253, 254, 255].

Sequence 11:

Using N=256 as an example, a sequence generated by using the formula (6) is:

[0, 1, 2, 4, 8, 16, 32, 3, 5, 6, 64, 9, 10, 17, 12, 128, 18, 33, 20, 34, 24, 36, 65, 7, 66, 40, 11, 68, 13, 48, 129, 19, 14, 72, 130, 21, 35, 132, 22, 80, 25, 37, 136, 26, 38, 67, 96, 41, 28, 144, 69, 42, 49, 70, 44, 73, 15, 160, 50, 131, 74, 52, 81, 133, 23, 76, 134, 192, 82, 56, 137, 27, 97, 39, 84, 138, 29, 145, 98, 43, 140, 30, 88, 146, 71, 100, 45, 161, 51, 148, 46, 75, 104, 162, 53, 152, 77, 164, 54, 193, 83, 112, 135, 57, 78, 85, 194, 168, 58, 139, 99, 196, 86, 60, 89, 141, 31, 176, 147, 101, 142, 200, 90, 149, 102, 105, 47, 92, 163, 150, 208, 153, 106, 113, 165, 55, 154, 79, 108, 166, 195, 224, 114, 169, 59, 156, 197, 87, 116, 170, 61, 177, 198, 172, 62, 201, 91, 120, 143, 178, 103, 93, 202, 180, 209, 151, 107, 204, 94, 210, 184, 155, 109, 225, 115, 167, 212, 157, 110, 117, 226, 171, 158, 216, 199, 228, 118, 121, 173, 63, 179, 174, 203, 232, 122, 181, 205, 95, 124, 182, 211, 240, 185, 206, 213, 186, 111, 227, 214, 188, 217, 159, 229, 119, 218, 230, 233, 123, 175, 220, 125, 234, 241, 183, 207, 236, 126, 242, 187, 215, 244, 189, 190, 219, 248, 231, 221, 235, 222, 237, 127, 243, 238, 245, 246, 249, 191, 250, 223, 252, 239, 247, 251, 253, 254, 255].

Sequence 12:

Using N=256 as an example, a sequence generated by using the formula (7) is:

[0, 1, 2, 4, 8, 16, 32, 3, 5, 6, 64, 9, 10, 17, 12, 128, 18, 33, 20, 34, 24, 65, 36, 7, 66, 40, 11, 68, 13, 48, 129, 19, 14, 72, 130, 21, 35, 132, 22, 80, 25, 37, 136, 26, 67, 38, 96, 41, 28, 144, 69, 42, 49, 70, 73, 44, 15, 160, 50, 131, 74, 81, 52, 133, 23, 76, 134, 192, 82, 56, 137, 27, 97, 39, 84, 138, 29, 145, 98, 43, 140, 30, 88, 146, 71, 100, 45, 161, 51, 148, 75, 46, 104, 162, 53, 152, 77, 193, 83, 164, 54, 112, 135, 57, 78, 85, 194, 168, 58, 139, 99, 196, 86, 89, 60, 141, 31, 176, 101, 147, 142, 200, 90, 149, 102, 105, 47, 92, 163, 150, 208, 153, 106, 113, 165, 55, 154, 79, 108, 195, 166, 224, 114, 169, 59, 156, 197, 87, 116, 170, 61, 177, 198, 201, 91, 172, 62, 120, 143, 178, 103, 93, 202, 209, 180, 151, 107, 204, 94, 210, 184, 109, 155, 225, 115, 167, 212, 157, 110, 117, 226, 171, 158, 216, 199, 228, 118, 121, 173, 63, 179, 203, 174, 232, 122, 181, 205, 95, 124, 211, 182, 240, 185, 206, 213, 186, 111, 227, 214, 217, 188, 159, 229, 119, 218, 230, 233, 123, 175, 220, 125, 234, 241, 183, 207, 236, 126, 242, 187, 215, 244, 189, 219, 190, 248, 231, 221, 235, 222, 237, 127, 243, 238, 245, 246, 249, 191, 250, 223, 252, 239, 247, 251, 253, 254, 255].

Sequence 13:

Using N=128 as an example, a sequence generated by using the formula (3) is:

[0, 1, 2, 4, 8, 16, 32, 3, 5, 6, 64, 9, 10, 17, 12, 18, 33, 20, 34, 24, 65, 36, 7, 66, 40, 11, 68, 13, 48, 19, 14, 72, 21, 35, 22, 80, 25, 37, 26, 67, 38, 96, 41, 28, 69, 42, 49, 70, 73, 44, 15, 50, 74, 81, 52, 23, 76, 82, 56, 27, 97, 39, 84, 29, 98, 43, 30, 88, 71, 100, 45, 51, 75, 46, 104, 53, 77, 83, 54, 112, 57, 78, 85, 58, 99, 86, 89, 60, 31, 101, 90, 102, 105, 47, 92, 106, 113, 55, 79, 108, 114, 59, 87, 116, 61, 91, 62, 120, 103, 93, 107, 94, 109, 115, 110, 117, 118, 121, 63, 122, 95, 124, 111, 119, 123, 125, 126, 127].

Sequence 14:

Using N=128 as an example, a sequence generated by using the formula (4) is:

[0, 1, 2, 4, 8, 16, 32, 3, 5, 6, 64, 9, 10, 17, 12, 18, 33, 20, 34, 24, 65, 36, 7, 66, 40, 11, 68, 13, 48, 19, 14, 72, 21, 35, 22, 80, 25, 37, 26, 38, 67, 96, 41, 28, 69, 42, 49, 70, 73, 44, 15, 50, 74, 81, 52, 23, 76, 82, 56, 27, 97, 39, 84, 29, 98, 43, 30, 88, 71, 100, 45, 51, 46, 75, 104, 53, 77, 54, 83, 112, 57, 78, 85, 58, 99, 86, 89, 60, 31, 101, 90, 102, 105, 47, 92, 106, 113, 55, 79, 108, 114, 59, 87, 116, 61, 91, 62, 120, 103, 93, 107, 94, 109, 115, 110, 117, 118, 121, 63, 122, 95, 124, 111, 119, 123, 125, 126, 127].

Sequence 15:

Using N=128 as an example, a sequence generated by using the formula (6) is:

[0, 1, 2, 4, 8, 16, 32, 3, 5, 6, 64, 9, 10, 17, 12, 18, 33, 20, 34, 24, 36, 65, 7, 66, 40, 11, 68, 13, 48, 19, 14, 72, 21, 35, 22, 80, 25, 37, 26, 38, 67, 96, 41, 28, 69, 42, 49, 70, 44, 73, 15, 50, 74, 52, 81, 23, 76, 82, 56, 27, 97, 39, 84, 29, 98, 43, 30, 88, 71, 100, 45, 51, 46, 75, 104, 53, 77, 54, 83, 112, 57, 78, 85, 58, 99, 86, 60, 89, 31, 101, 90, 102, 105, 47, 92, 106, 113, 55, 79, 108, 114, 59, 87, 116, 61, 62, 91, 120, 103, 93, 107, 94, 109, 115, 110, 117, 118, 121, 63, 122, 95, 124, 111, 119, 123, 125, 126, 127].

Sequence 16:

Using N=128 as an example, a sequence generated by using the formula (7) is:

[0, 1, 2, 4, 8, 16, 32, 3, 5, 6, 64, 9, 10, 17, 12, 18, 33, 20, 34, 24, 65, 36, 7, 66, 40, 11, 68, 13, 48, 19, 14, 72, 21, 35, 22, 80, 25, 37, 26, 67, 38, 96, 41, 28, 69, 42, 49, 70, 73, 44, 15, 50, 74, 81, 52, 23, 76, 82, 56, 27, 97, 39, 84, 29, 98, 43, 30, 88, 71, 100, 45, 51, 75, 46, 104, 53, 77, 83, 54, 112, 57, 78, 85, 58, 99, 86, 89, 60, 31, 101, 90, 102, 105, 47, 92, 106, 113, 55, 79, 108, 114, 59, 87, 116, 61, 91, 62, 120, 103, 93, 107, 94, 109, 115, 110, 117, 118, 121, 63, 122, 95, 124, 111, 119, 123, 125, 126, 127].

Sequence 17:

Using N=64 as an example, a sequence generated by using the formula (3) is:

[0, 1, 2, 4, 8, 16, 32, 3, 5, 6, 9, 10, 17, 12, 18, 33, 20, 34, 24, 36, 7, 40, 11, 13, 48, 19, 14, 21, 35, 22, 25, 37, 26, 38, 41, 28, 42, 49, 44, 15, 50, 52, 23, 56, 27, 39, 29, 43, 30, 45, 51, 46, 53, 54, 57, 58, 60, 31, 47, 55, 59, 61, 62, 63].

Sequence 18:

Using N=64 as an example, a sequence generated by using the formula (4) is:

[0, 1, 2, 4, 8, 16, 32, 3, 5, 6, 9, 10, 17, 12, 18, 33, 20, 34, 24, 36, 7, 40, 11, 13, 48, 19, 14, 21, 35, 22, 25, 37, 26, 38, 41, 28, 42, 49, 44, 15, 50, 52, 23, 56, 27, 39, 29, 43, 30, 45, 51, 46, 53, 54, 57, 58, 60, 31, 47, 55, 59, 61, 62, 63].

Sequence 19:

Using N=64 as an example, a sequence generated by using the formula (6) is:

[0, 1, 2, 4, 8, 16, 32, 3, 5, 6, 9, 10, 17, 12, 18, 33, 20, 34, 24, 36, 7, 40, 11, 13, 48, 19, 14, 21, 35, 22, 25, 37, 26, 38, 41, 28, 42, 49, 44, 15, 50, 52, 23, 56, 27, 39, 29, 43, 30, 45, 51, 46, 53, 54, 57, 58, 60, 31, 47, 55, 59, 61, 62, 63].

Sequence 20:

Using N=64 as an example, a sequence generated by using the formula (7) is:

[0, 1, 2, 4, 8, 16, 32, 3, 5, 6, 9, 10, 17, 12, 18, 33, 20, 34, 24, 36, 7, 40, 11, 13, 48, 19, 14, 21, 35, 22, 25, 37, 26, 38, 41, 28, 42, 49, 44, 15, 50, 52, 23, 56, 27, 39, 29, 43, 30, 45, 51, 46, 53, 54, 57, 58, 60, 31, 47, 55, 59, 61, 62, 63].

It should be noted that the foregoing sequences are merely examples, and application of the sequences to a polar encoding process helps improve encoding/decoding performance of a polar code. For any exemplified sequence, on a premise of not affecting an overall effect of the sequence, adjustments or equivalent replacements in the following several aspects may include but are not limited to:

1. Locations of fewer elements in the sequence are exchanged. For example, a sequence number location may be adjusted by a specified magnitude, for example, the specified magnitude is 5. A location of an element whose sequence number is 10 may be adjusted by left and right five locations.

2. Some elements in the sequence are adjusted, but channel sets that are used to transmit T-bit information and that are selected based on the sequence are consistent or similar.

3. The sequence includes N elements from 0 to N−1, and the N elements from 0 to N−1 represent sequence numbers of N polar channels. In one embodiment, the sequence numbers of the N polar channels may alternatively start from 1 and end up with N, that is, adding 1 to the sequence numbers in the foregoing sequence. This is also a sequence number form in the foregoing computation manner. In one embodiment, a sequence number or an identifier of the polar channel may alternatively be represented in another manner. The specific representation manner does not affect a specific location of the polar channel in the sequence.

4. Sequence numbers of N polar channels in the sequence are arranged in ascending order of reliability of the N polar channels. In this case, K polar channels are selected in descending order of the reliability, that is, polar channels corresponding to last K sequence numbers in any one of the foregoing sequences are selected. In one embodiment, sequence numbers of N polar channels may alternatively be arranged in descending order of reliability of the N polar channels. That is, elements in the foregoing sequence are arranged in reverse order or in inverse order. In this case, K polar channels are selected in descending order of the reliability, that is, polar channels corresponding to first K sequence numbers are selected.

5. The foregoing sequence may alternatively be represented by using normalized reliability sequences or equivalent reliability sequences of various channels. For example, a sorting location of a channel x in the foregoing sequence is n (where the leftmost location is denoted as 1). In this case, reliability of the channel may be represented as n or normalized n/N, where N is a length of the sequence.

Figure 3:
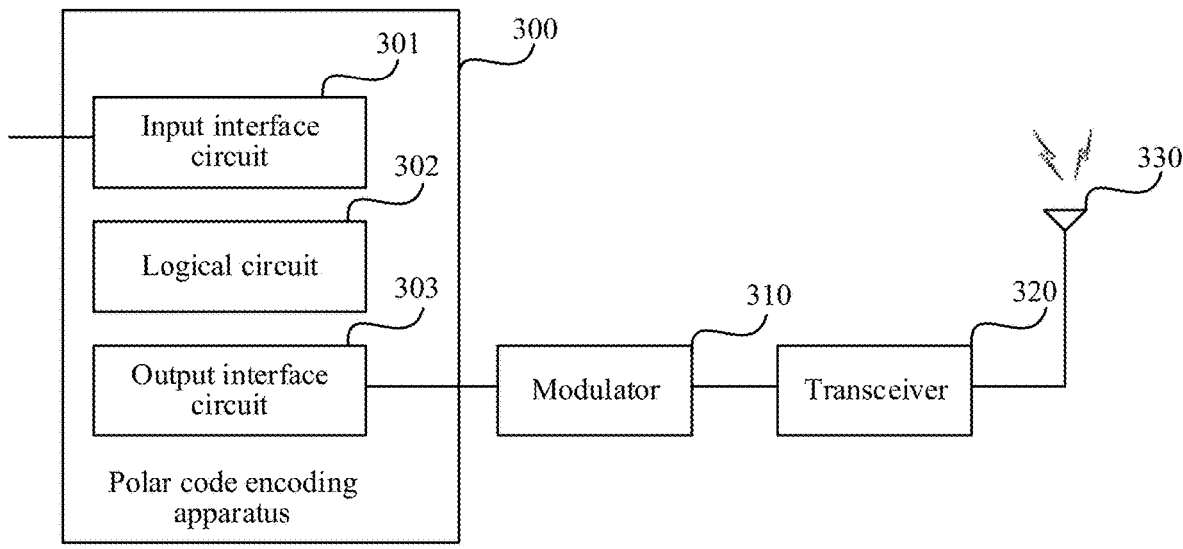
FIG. 3 is a first schematic structural diagram of a polar code encoding apparatus according to an embodiment of this application.

Based on a same inventive concept of the polar code encoding method shown in FIG. 2, as shown in FIG. 3, an embodiment of this application further provides a polar code encoding apparatus 300. The polar code encoding apparatus 300 is configured to perform the polar code encoding method shown in FIG. 2. A part or all of the polar code encoding method shown in FIG. 2 may be implemented by using hardware or software. When the hardware is used for implementation, the polar code encoding apparatus 300 includes: an input interface circuit 301, configured to obtain to-be-encoded bits; a logical circuit 302, configured to perform the polar code encoding method shown in FIG. 2, where for details, refer to the descriptions in the foregoing method embodiment, and details are not described herein again; and an output interface circuit 303, configured to output an encoded bit sequence.

Further, the encoded bit sequence output by the encoding apparatus 300 is modulated by a modulator 310 and then is output to a transceiver 320. The transceiver 320 performs corresponding processing (including but not limited to digital-to-analog conversion and/or frequency conversion) on a modulated sequence, and then sends the sequence by using an antenna 330.

In one embodiment, during specific implementation, the polar code encoding apparatus 300 may be a chip or an integrated circuit.

Figure 4:
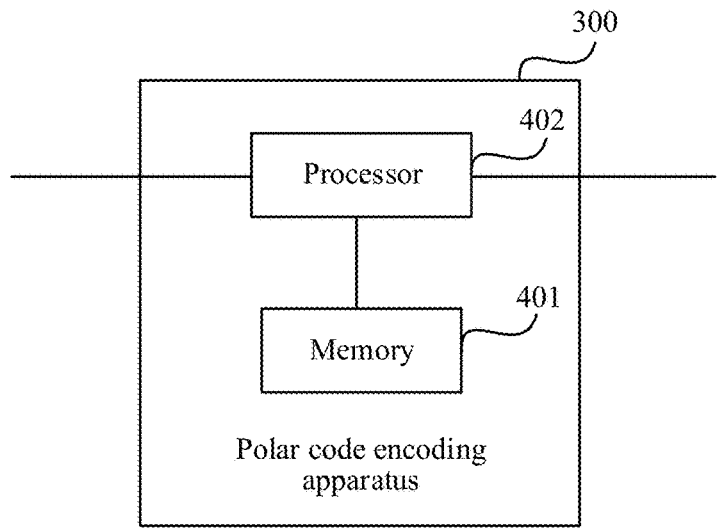
FIG. 4 is a second schematic structural diagram of a polar code encoding apparatus according to an embodiment of this application.

In one embodiment, when a part or all of the polar code encoding method in the foregoing embodiment is implemented by using software, as shown in FIG. 4, the polar code encoding apparatus 300 includes: a memory 401, configured to store a program; and a processor 402, configured to execute the program stored in the memory 401, where when the program is executed, the polar code encoding apparatus 300 may implement the polar code encoding method provided in the embodiment in FIG. 2.

Figure 5:
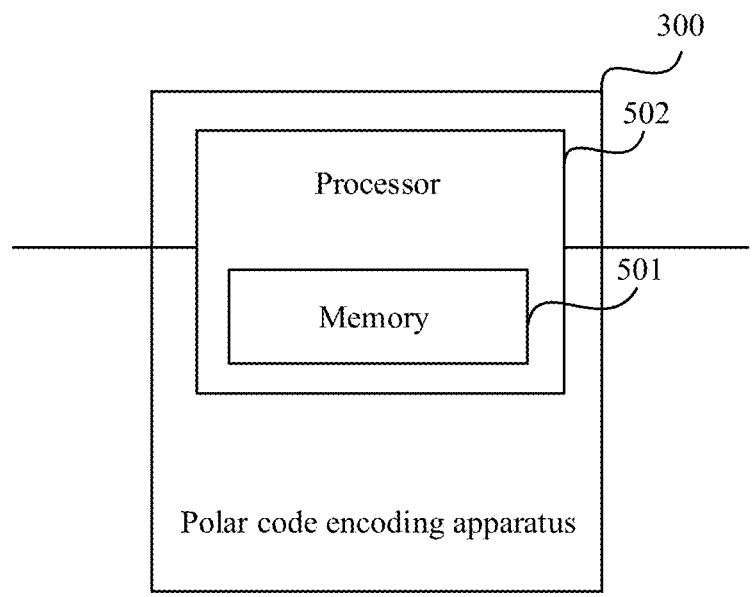
FIG. 5 is a third schematic structural diagram of a polar code encoding apparatus according to an embodiment of this application.

In one embodiment, the memory 401 may be a physically independent unit. In one embodiment, as shown in FIG. 5, a memory 501 and a processor 502 may be integrated together.

In one embodiment, when a part or all of the encoding method in the embodiment in FIG. 2 is implemented by using software, the polar code encoding apparatus 300 may alternatively include only a processor 402. A memory 401 configured to store a program is located outside of the polar code encoding apparatus 300, and the processor 402 is connected to the memory 401 by using a circuit/a cable, and is configured to read and execute the program stored in the memory 401.

The processor 402 may be a central processing unit (CPU), a network processor (NP), or a combination of a CPU and an NP.

The processor 402 may further include a hardware chip. The foregoing hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory in the foregoing embodiments may include a volatile memory, for example, a random-access memory (RAM). Alternatively, the memory may include a non-volatile memory, such as a flash memory, a hard disk drive (HDD), or a solid-state drive (SSD). Alternatively, the memory may include a combination of the foregoing types of memories.

Figure 6:
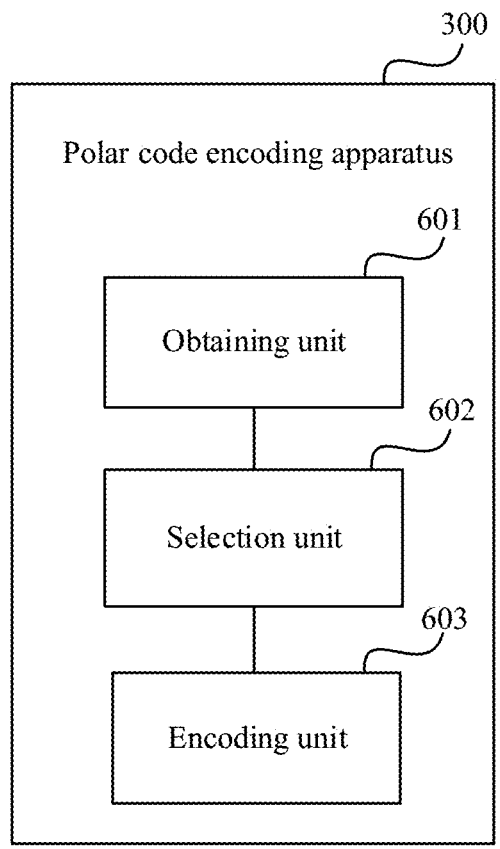
FIG. 6 is a fourth schematic structural diagram of a polar code encoding apparatus according to an embodiment of this application.

Based on the polar code encoding method shown in FIG. 2, as shown in FIG. 6, an embodiment of this application further provides a polar code encoding apparatus 300. The polar code encoding apparatus 300 is configured to perform the polar code encoding method shown in FIG. 2. The polar code encoding apparatus 300 includes:

an obtaining unit 601, configured to obtain a first sequence used to encode K to-be-encoded bits, where the first sequence includes sequence numbers of N polar channels, and the sequence numbers of the N polar channels are arranged in the first sequence based on reliability of the N polar channels, where K is a positive integer, N is a mother code length of a polar code, N is a positive integer that is a power of 2, and K≤N;

a selection unit 602, configured to select sequence numbers of K polar channels from the first sequence in descending order of the reliability; and an encoding unit 603, configured to: place the K to-be-encoded bits based on the selected sequence numbers of the K polar channels, and perform polar code encoding on the K to-be-encoded bits.

The first sequence may be any one of the sequences exemplified above, or may be a sequence whose sequence number is less than N and that is selected from a second sequence having a length of $N_{max}$ (where the sequence number starts from 0), and the second sequence may be any one of the sequences exemplified above. Reliability of an $i^{th}$ polar channel in the N polar channels may also be determined by using any one of the foregoing exemplified formulas.

An embodiment of this application further provides a computer storage medium, storing a computer program, where the computer program is used to perform the polar code encoding method shown in FIG. 2.

An embodiment of this application further provides a computer program product including an instruction. When the computer program product is run on a computer, the computer is enabled to perform the polar code encoding method shown in FIG. 2.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the scope of the embodiments of this application. This application is intended to cover these modifications and variations provided that they fall within the scope of protection defined by the following claims and their equivalent technologies.

What is claimed is:

1. A polar code encoding method for encoding data in a telecommunications system, comprising:

obtaining, by an encoding device of the telecommunications system, a first sequence used to encode K to-be-encoded bits to be transmitted from a terminal to a network device of the telecommunications system, wherein the first sequence comprises sequence numbers of N polar channels of a polar code, wherein the sequence numbers of the N polar channels are arranged based on corresponding reliabilities of the N polar channels, wherein K is a positive integer, N is a mother code length of the polar code, $N=2^n$, n is a positive integer, and K≤N, wherein the first sequence is a second sequence or a subset of the second sequence, wherein the second sequence comprises sequence numbers of $N_{max}$ polar channels, wherein the sequence numbers of the $N_{max}$ polar channels are arranged based on corresponding reliabilities of the $N_{max}$ polar channels, wherein $N_{max}$ is a positive integer that is a power of 2, and $N_{max} \geq N$, wherein a reliability of an $i^{th}$ polar channel in the second sequence is:

$$W_i = \sum_{(j=0)}^{n-1} B_j \times (\beta^j + a_0 \times b_0^j + B_{e1} \times a_1 \times b_1^j + B_{e2} \times a_2 \times b_2^j),$$

or $$W_i = \sum_{(j=0)}^{n-1} B_j \times (\beta^j + a_0 \times b_0^j + B_{e1} \times a_1 \times b_1^j),$$

wherein i is a channel sequence number of the $i^{th}$ polar channel and $0 \leq i \leq N-1$, $W_i$ is the reliability of the $i^{th}$ polar channel; $i=Bn_{n-1}B_{n-2} \ldots B_0$, and wherein $B_{n-1}B_{n-2} \ldots B_0$ is a binary representation of i, $B_j$ is a value of a $j^{th}$ bit in the binary representation of the channel sequence number i, wherein $B_j \in \{0,1\}$, β is a real kernel function, $b_0$, $b_1$, and $b_2$ are a plurality of complex kernel functions, $a_0$, $a_1$, and $a_2$ are a plurality of weighting factors, and $B_{e1}$ and $B_{e2}$ respectively indicate that corresponding complex functions have an impact on the reliability of the $i^{th}$ polar channel when an $e_1^{th}$ bit and an $e_2^{th}$ bit in the binary representation of the channel sequence number i are 1;

selecting sequence numbers of K polar channels from the first sequence in a descending order of the corresponding reliabilities of the N polar channels;

placing the K to-be-encoded bits based on the selected sequence numbers of the K polar channels; and performing polar code encoding on the K to-be-encoded bits based on the K polar channels to obtain an encoded bit sequence.

2. The method according to claim 1, wherein the plurality of weighting factors and the plurality of complex kernel functions comprise $a_0=0.169$, $b_0=0.8805$, $a_1=-0.096$, $b_1=0.2432+0.2432I$, wherein I is an imaginary unit, $e_1=6$, $a_2=0.038$, $b_2=0.8262$, and $e_2=9$; and the reliability of the $i^{th}$ polar channel in the second sequence is:

$$W_i = \sum_{(j=0)}^{n-1} B_j \times (\beta^j + 0.169 \times 0.8805^j - B_6 \times 0.096 \times (0.2432 + 0.2432I)^j + B_9 \times 0.038 \times 0.8262^j).$$

3. The method according to claim 1, wherein the plurality of weighting factors and the plurality of complex kernel functions comprise $a_0=0.1733$, $b_0=0.5486$, $a_1=-0.0279$, $b_1=0.5222+0.5222I$, wherein I is an imaginary unit, $e_1=5$, $a_2=-0.07$, $b_2=0$, and $e_2=6$; and the reliability of the $i^{th}$ polar channel in the second sequence is:

$$W_i = \sum_{(j=0)}^{n-1} B_j \times (\beta^j + 0.1733 \times 0.5486^j - B_5 \times 0.0279 \times (0.5222 + 0.5222I)^j - B_6 \times 0.07 \times 0^j).$$

4. The method according to claim 1, wherein the plurality of weighting factors and the plurality of complex kernel functions comprise $a_0=0.169$, $b_0=0.601$, $a_1=-0.07694$, $b_1=0.0769+0.0769I$, wherein I is an imaginary unit, and $e_1=6$; and the reliability of the $i^{th}$ polar channel in the second sequence is:

$$W_i = \sum_{(j=0)}^{n-1} B_j \times (\beta^j + 0.169 \times 0.601^j - B_6 \times 0.07694 \times (0.0769 + 0.0769I)^j).$$

5. The method according to claim 1, wherein the plurality of weighting factors and the plurality of complex kernel functions comprise $a_0=0.169$, $b_0=0.601$, $a_1=-0.0475$, $b_1=0$, and $e_1=6$; and the reliability of the $i^{th}$ polar channel in the second sequence is:

$$W_i = \sum_{(j=0)}^{n-1} B_j \times (\beta^j + 0.169 \times 0.601^j - B_6 \times 0.0475 \times 0^j).$$

6. The method according to claim 1, wherein $\beta=2^{1/4}$.

7. The method according to claim 1, wherein the second sequence is one of a plurality of sequences, wherein the sequence numbers of the Nmax polar channels in the second sequence are arranged in an ascending order of the corresponding reliabilities of the Nmax polar channels.

8. An apparatus for encoding data in a telecommunications system, comprising:
at least one memory, configured to store instructions; and
at least one processor, configured to execute the instructions stored in the at least one memory to perform operations that comprise:
obtaining a first sequence used to encode K to-be-encoded bits to be transmitted from the apparatus to a network device of the telecommunications system, wherein the first sequence comprises sequence numbers of N polar channels of a polar code, wherein the sequence numbers of the N polar channels are arranged based on corresponding reliabilities of the N polar channels, wherein K is a positive integer, N is a mother code length of the polar code, $N=2^n$, n is a positive integer, and K≤N, wherein the first sequence is a second sequence or a subset of the second sequence, wherein the second sequence comprises sequence numbers of $N_{max}$ polar channels, wherein the sequence numbers of the $N_{max}$ polar channels are arranged based on corresponding reliabilities of the $N_{max}$ polar channels, wherein $N_{max}$ is a positive integer that is a power of 2, and $N_{max} \geq N$, wherein a reliability of an $i^{th}$ polar channel in the second sequence is:

$$W_i = \sum_{(j=0)}^{n-1} B_j \times (\beta^j + a_0 \times b_0^j + B_{e1} \times a_1 \times b_1^j + B_{e2} \times a_2 \times b_2^j),$$

or $$W_i = \sum_{(j=0)}^{n-1} B_j \times (\beta^j + a_0 \times b_0^j + B_{e1} \times a_1 \times b_1^j),$$

wherein i is a channel sequence number of the $i^{th}$ polar channel and $0 \leq i \leq N-1$, $W_i$ is the reliability of the $i^{th}$ polar channel; $i=B_{n-1}B_{n-2} \ldots B_0$, and wherein $B_{n-1}B_{n-2} \ldots B_0$ is a binary representation of i, $B_i$ is a value of a $j^{th}$ bit in the binary representation of the channel sequence number i, wherein $B_j \in \{0, 1\}$, $\beta$ is a real kernel function, $b_0$, $b_1$, and $b_2$ are a plurality of complex kernel functions, $a_0$, $a_1$, and $a_2$ are a plurality of weighting factors, and $B_{e1}$ and $B_{e2}$ respectively indicate that corresponding complex functions have an impact on the reliability of the $i^{th}$ polar channel when an $e_1^{th}$ bit and an $e_2^{th}$ bit in the binary representation of the channel sequence number i are 1;

selecting sequence numbers of K polar channels from the first sequence in a descending order of the corresponding reliabilities of the N polar channels;

placing the K to-be-encoded bits based on the selected sequence numbers of the K polar channels; and performing polar code encoding on the K to-be-encoded bits based on the K polar channels to obtain an encoded bit sequence.

9. The apparatus according to claim 8, wherein the plurality of weighting factors and the plurality of complex kernel functions comprise $a_0=0.169$, $b_0=0.8805$, $a_1=-0.096$, $b_1=0.2432+0.2432I$, wherein I is an imaginary unit, $e_1=6$, $a_2=0.038$, $b_2=0.8262$, and $e_2=9$; and the reliability of the $i^{th}$ polar channel in the second sequence is:

$$W_i = \sum_{(j=0)}^{n-1} B_j \times (\beta^j + 0.169 \times 0.8805^j - B_6 \times 0.096 \times (0.2342 + 0.2432I)^j + B_9 \times 0.038 \times 0.8262^j).$$

10. The apparatus according to claim 8, wherein the plurality of weighting factors and the plurality of complex kernel functions comprise $a_0=0.1733$, $b_0=0.5486$, $a_1=-0.0279$, $b_1=0.5222+0.5222I$, wherein I is an imaginary unit, $e_1=5$, $a_2=-0.07$, $b_2=0$, and $e_2=6$; and the reliability of the $i^{th}$ polar channel in the second sequence is:

$$W_i = \sum_{(j=0)}^{n-1} B_j \times (\beta^j + 0.1733 \times 0.5486^j - B_5 \times 0.0279 \times (0.5222 + 0.5222I)^j - B_6 \times 0.07 \times 0^j).$$

11. The apparatus according to claim 8, wherein the plurality of weighting factors and the plurality of complex kernel functions comprise $a_0=0.169$, $b_0=0.601$, $a_1=-0.07694$, $b_1=0.0769+0.0769I$, wherein I is an imaginary unit, and $e_1=6$; and the reliability of the $i^{th}$ polar channel in the second sequence is:

$$W_i = \sum_{(j=0)}^{n-1} B_j \times (\beta^j + 0.169 \times 0.601^j - B_6 \times 0.07694 \times (0.0769 + 0.0769I)^j).$$

12. The apparatus according to claim 8, wherein the plurality of weighting factors and the plurality of complex kernel functions comprise $a_0=0.169$, $b_0=0.601$, $a_1=-0.0475$, $b_1=0$, and $e_1=6$; and the reliability of the $i^{th}$ polar channel in the second sequence is:

$$W_i = \sum_{(j=0)}^{n-1} B_j \times (\beta^j + 0.169 \times 0.601^j - B_6 \times 0.0475 \times 0^j).$$

13. The apparatus according to claim 8, wherein $\beta=2^{1/4}$.

14. The apparatus according to claim 8, wherein the second sequence is one of a plurality of sequences, wherein the sequence numbers of the Nmax polar channels in the second sequence are arranged in an ascending order of the corresponding reliabilities of the Nmax polar channels.

* * * * *